US007002848B2

(12) United States Patent
Takase et al.

(10) Patent No.: US 7,002,848 B2
(45) Date of Patent: Feb. 21, 2006

(54) NONVOLATILE SEMICONDUCTOR MEMORY DEVICE

(75) Inventors: Yoshinori Takase, Tokyo (JP); Hideaki Kurata, Kodaira (JP); Keiichi Yoshida, Musashimurayama (JP); Michitaro Kanamitsu, Ome (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/505,952

(22) PCT Filed: Feb. 28, 2002

(86) PCT No.: PCT/JP02/01847

§ 371 (c)(1),
(2), (4) Date: Aug. 27, 2004

(87) PCT Pub. No.: WO03/073433

PCT Pub. Date: Sep. 4, 2003

(65) Prior Publication Data

US 2005/0105373 A1 May 19, 2005

(51) Int. Cl.
*G11C 16/04* (2006.01)

(52) U.S. Cl. ............................ 365/185.28; 365/185.24

(58) Field of Classification Search ........... 365/185.28, 365/185.24, 185.01
See application file for complete search history.

(56) References Cited

U.S. PATENT DOCUMENTS

| | | | | |
|---|---|---|---|---|
| 5,898,621 A * | 4/1999 | Takahashi et al. | ..... | 365/185.33 |
| 5,999,445 A * | 12/1999 | Rolandi et al. | ........ | 365/185.03 |
| 6,046,936 A | 4/2000 | Tsujikawa et al. | ..... | 365/185.03 |
| 6,078,519 A | 6/2000 | Kanamitsu et al. | .... | 365/185.03 |
| 6,081,453 A * | 6/2000 | Iwahashi | .............. | 365/185.22 |

FOREIGN PATENT DOCUMENTS

| | | |
|---|---|---|
| JP | 11-232886 | 8/1999 |
| JP | 11-345494 | 12/1999 |
| JP | 2001-23383 | 1/2001 |

* cited by examiner

*Primary Examiner*—Thong Q. Le
(74) *Attorney, Agent, or Firm*—Miles & Stockbridge PC

(57) ABSTRACT

This is a nonvolatile semiconductor memory device capable of raising the speed of write operation of Y access circuits in a 1×sense latch circuit+2×SRAM configuration. In a multi-value flash memory, in a mode of writing from the lower voltage side, writing and erratic determination are performed after data are transferred from SRAMs to a sense latch circuit for "10" and "00" distributions; after the data transfer for "01" distribution, writing is done; after the data transfer for "11" distribution word disturb determination is done; and simplified upper limit determination is done in this sequence. In particular by (1) writing from the lower voltage side of the threshold voltage distribution in the multi-value memory and (2) consecutive application of "write processing" and "upper limit determination processing" to each threshold voltage distribution, after the end of write processing for "10" and "00" distribution, since the threshold voltages of all the memory cells are lower than the upper limit determination voltages of the "10" and "00" distributions, no transfer of write data is needed in upper limit determination processing because other threshold voltage distributions are not masked.

12 Claims, 30 Drawing Sheets

(a)

(b)

(a)

(b)

| ADDRESS | | 0 | 1 | 2 | 3 | 4 |
|---|---|---|---|---|---|---|
| WRITTEN DATA | | FF | F0 | 00 | 0F | FF |
| EXPECTED VALUE OF MEMORY CELL | | FF | F0 | 00 | 0F | 0F |
| OBJECT OF UPPER LIMIT DETERMINATION | SRAM USED | ○ | | | | ○ |
| | SIMPLIFIED UPPER LIMIT DETERMINATION | ○ | | | | |

NONVOLATILE SEMICONDUCTOR MEMORY DEVICE

BACKGROUND OF THE INVENTION

1. Technical Field

The present invention relates to a semiconductor memory device, and more particularly to a technique that can be effectively applied to the write operation of a nonvolatile semiconductor memory device, such as a multi-value flash memory having a memory array so configured that each of a plurality of memory cells can store data of a plurality of bits as a threshold voltage in Y access circuits each of a 1×sense latch circuit+2×SRAM configuration.

2. Background Art

According to the findings of research by the present inventor, the following techniques are conceivable for application to a flash memory as an example of nonvolatile semiconductor memory device.

For instance, a flash memory uses nonvolatile memory elements each having a control gate and a floating gate as memory cells, and each memory cell can be configured of one transistor. For such a flash memory, with a view to increasing the storage capacity, the concept of so-called "multi-value" flash memory in which data of two bits are more are stored into each memory cell is proposed. In such a multi-value flash memory, the threshold voltage can be varied stepwise by controlling quantity of electric charges injected into the floating gate, and information of a plurality of bits can be matched with each threshold voltage to store it.

Further for the flash memory referred to above, as the chip size grows with increase in storage capacity, it is required to restrain this growth in chip size. In considering this chip size for instance, since there are many constraints on the area of a memory array consisting of a plurality of memory cells arranged in a grid shape at the intersection points of word lines and bit lines, it is necessary to take note of the square measure of the Y access circuits of this memory array. The Y access circuits of a flash memory may have a circuit configuration, for example, embodying a technique of so-called single end sense formula (see FIG. 4 to be referenced afterwards, for instance).

The Y access circuits using this single end sense formula, as it has a configuration in which the sense latch circuit is arranged at one end of global bit lines, is used for the purpose of reducing the square measure (reducing the number of elements). Further for the Y access circuits, with an eye to reducing the square measure, a technique using a so-called 1×sense latch circuit+2×SRAM configuration is proposed instead of a data transfer circuit having a so-called 1×sense latch circuit+2×data latch circuit configuration. In this 1×sense latch circuit+2×SRAM configuration (see FIG. 6 to be referenced afterwards, for instance), two SRAMs are allocated to a plurality of sense latch circuit in each bank, and data of higher order bits are stored in one of the SRAMs while data of lower order bits are stored in the other.

Incidentally, having studied the aforementioned technique of using the 1×sense latch circuit+2×SRAM configuration for the Y access circuits of the flash memory, the present inventor found the following fact.

The aforementioned 1×sense latch circuit+2×SRAM configuration, unlike the 1×sense latch circuit+2×data latch circuit configuration, involves a problem that it takes time to transfer write data on the SRAMs to the sense latch circuit. For instance, where write data are stored in a data latch circuit, as their transfer from the data latch circuit to the sense latch circuit can be accomplished in parallel, the transfer time required will be only about 1 to 2 μs. By contrast, where write data are stored in a SRAM, as transfer from the SRAM to the sense latch circuit is accomplished serially, each transfer will take about 25 μs.

In view of this problem, the present inventor took note of the write operation of the Y access circuits of the 1×sense latch circuit+2×SRAM configuration and, with an eye to accelerating this write operation, thought of taking into consideration of the number times of data transfer from the SRAM to the sense latch circuit.

An object of the present invention is to provide a nonvolatile semiconductor memory device, such as a multi-value flash memory, capable of realizing acceleration of the this write operation the Y access circuits of the 1×sense latch circuit+2×SRAM configuration.

The above-stated and other objects and novel features of the invention will become more apparent from the following description in the specification when taken in conjunction with the accompanying drawings.

DISCLOSURE OF THE INVENTION

Typical aspects of the invention disclosed in the present application will be briefly described below.

According to the invention, a nonvolatile semiconductor memory device comprises: a plurality of word lines; a plurality of bit lines; and a plurality of memory cells each connected to the corresponding word line and the corresponding bit line and having a control gate and a floating gate, and each of the plurality of memory cells has a memory array so configured as to be able to store data of a plurality of bits as threshold voltages. The nonvolatile semiconductor memory device has the following characteristic features in its write operation.

(1) The nonvolatile semiconductor memory device has a write mode in which, out of a plurality of threshold voltage distributions, write operation is performed from the side of a lower threshold voltage distribution; write processing for each threshold voltage distribution out of the plurality of threshold voltage distributions is applied to memory cells to be written in; and upper limit determination processing to confirm that no excessive writing of each threshold voltage distribution is performed without discriminating any of the memory cells from others. This write mode contributes to reducing, in a configuration having a sense latch circuit connected to each memory cell and memory circuits (SRAMs) connected to this sense latch circuit via a common input/output line, the number of data transfers from the SRAMs to the sense latch circuit. In the implementation of this mode, write processing and upper limit determination processing are consecutively performed for each threshold voltage distribution.

(2) Out of a plurality of threshold voltage distributions, write processing is performed for a level n threshold voltage distribution and a level n+1 threshold voltage distribution, read processing is performed at the upper limit determination voltage level of the level n threshold voltage distribution and the read voltage level of the level n+1 threshold voltage distribution without discriminating any of the memory cells from others, and the existence of no memory cell having a threshold voltage distribution between the upper limit determination voltage level and the read voltage level is determined, the write mode including upper limit determination processing to confirm that no excessive writing is done, thereby contributing to reducing the number of data transfers from the SRAMs to the sense latch circuit. In the implementation of these modes, upper limit determination processing is performed for the lowest erase level of threshold voltage distribution after the write processing of the plurality of threshold voltage distributions is completed.

(3) In (2) above, upper limit determination processing is to determine the memory cell subject to upper limit determination on the basis of data stored in the memory cell, and to perform additional write processing for writing again, without erasure, into any memory cell on a word line having already undergone write processing. It is thereby made possible to write again without performing erase processing.

Thus the nonvolatile semiconductor memory device according to the invention embodies a technique to form, in a memory array configuration comprising multi-value memory cells, threshold voltage distributions from the lower side upward and to thereby accelerate write verify determination. By forming threshold voltage distributions from the lower side upward, where all the memory cells in the threshold voltage distributions have surpassed the lower limit of these threshold voltage distributions, verify determination is performed only to confirm that there is no memory cell having a threshold voltage above the upper limit of these threshold voltage distributions, and accordingly it is made possible to eliminate the need for consideration of memory cells in other already formed threshold voltage distributions. Thus this technique enables write operation to be increased in speed.

Therefore, as stated above, the write mode in which threshold voltage distributions of multi-value memory cells are written from the lower voltage side in Y access circuits of the 1×sense latch circuit+2×SRAM configuration is used, and it is thereby made possible to reduce the number of data transfers from the SRAMs to the sense latch circuit and thereby to increase the speed of write operation.

It is further made possible also to reduce the number of data transfers from the SRAMs to the sense latch circuit and thereby to increase the speed of write operation by adopting a write mode in which upper limit determination is used. Furthermore, as the use of upper limit determination makes possible additional writing, no erasure is needed when memory cells on one word line are to be divided a plurality of times and written in, and this also contributes to shortening the length of writing time.

BEST MODES FOR CARRYING OUT THE INVENTION

The best modes for carrying out the present invention will be described in detail below with reference to drawings. In all the drawings illustrating the modes for implementation, members having the same function will be denoted by respectively the same reference signs, and their description will not be repeated.

Figure 1:
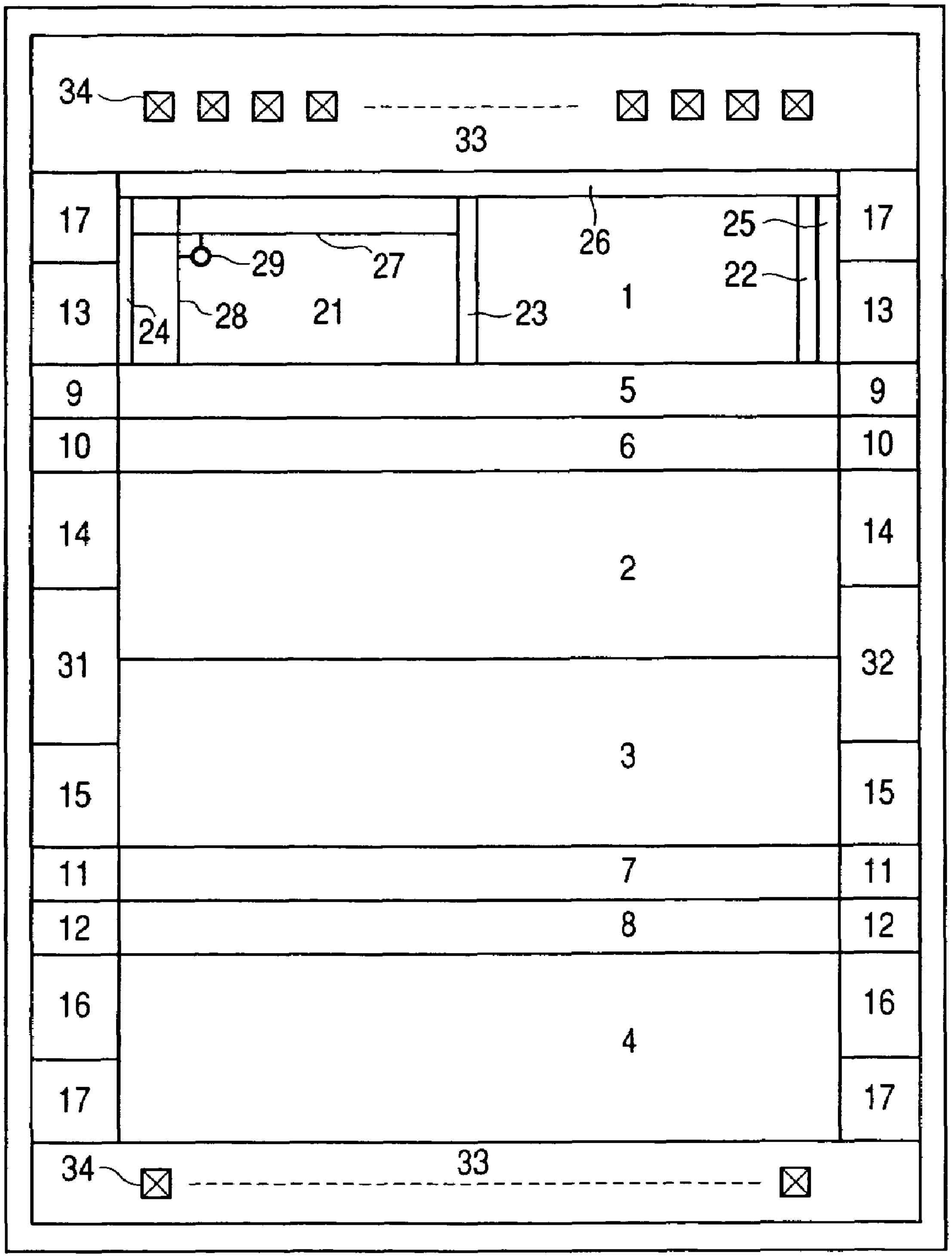
FIG. 1 schematically illustrates a flash memory, which embodies one mode of realizing a nonvolatile semiconductor memory device according to the invention.

One example of configuration of a flash memory in one mode of realizing the nonvolatile semiconductor memory device will be described with reference to FIG. 1.

The flash memory in this mode for carrying out the invention maybe for example, though not limited to, a flash memory configured of a plurality of banks capable of storing in each of its memory cells data of a plurality of bits as a threshold voltage and each capable of operating independently of others; it comprises four banks 1 through 4; sense latch rows 5 through 8, Y access circuits 9 through 12 and SRAMs 13 through 16 respectively corresponding to the banks 1 through 4; and an indirect circuit 17, and circuit elements constituting these circuits are over a single semiconductor substrate of monocrystalline silicon or the like by known manufacturing technology for semiconductor integrate circuits.

Each of the banks 1 through 4 is configured of a memory array 21, three sub-decoders 22 through 24 arranged at the center of and outside this memory array 21 in the Y direction (=the direction of word lines), a main decoder 25 arranged outside one sub-decoder 22, and one gate decoder 26 arranged outside the memory array 21 in the X direction (=the direction of bit lines) among other elements. The memory array 21, whose details will be described afterwards, is connected to a plurality of word lines 27 and a plurality of bit lines 28, and is configured of a plurality of memory rows in which a plurality of memory cells 29, each having a control gate and a floating gate, are connected in parallel. The sub-decoders 22 through 24, the main decoder 25 and the gate decoder 26, in accordance with the results of decoding, sets to a selected level one of the word lines 27 connected any memory cell 29 in each memory array 21.

Each two of the sense latch rows 5 through 8 are arranged to adjoin the banks 1 through 4 and to intervene between two banks, the banks 1 and 2 and the banks 3 and 4, respectively. These sense latch rows 5 through 8 detects the level of the bit lines 28 at the time of read and provides a potential corresponding to write data at the time of write. The Y access circuits 9 through 12 are arranged along the peripheries of the chip respectively adjoining the sense latch rows 5 through 8. These Y access circuits 9 through 12, of which details will be described afterwards, use the single end sense formula (NMOS gate-received sense formula) transfer write data and read data. The SRAMs 13 through 16 are arranged along the peripheries of the chip respectively adjoining the Y access circuits 9 through 12. These SRAMs 13 through 16 hold write data and read data.

The indirect circuit 17 is arranged on the peripheries of the chip. This indirect circuit 17 includes a control circuit 31 for controlling erase, write and read operations, a power supply circuit 32 for generating various voltages needed for these operations, and an the input/output circuit 33 for accepting address signals, write data, commands and control signals entered from outside and supplying them to internal circuits and at the same timeout putting read data. The input/output circuit 33 is arranged outside the peripheries of the chip in the X direction, and is provided with a plurality of pads 34 which constitute external terminals for connection to outside.

One example of configuration of the memory array in the flash memory in this mode of implementation will be described with reference to FIG. 2. To this memory array in the flash memory in this mode of implementation, a memory array configuration known as the AG-AND is applied in this example though it is not limited to this configuration, and various other memory array configurations including those known as the AND type and the NAND type are also applicable. Obviously, individual memory cells can be applied to flash memories in which the threshold voltage is set at two levels for storing two-value data, set to four levels for storing four-value data, or set to three, dive or more levels for storing multi-value data.

Figure 2:
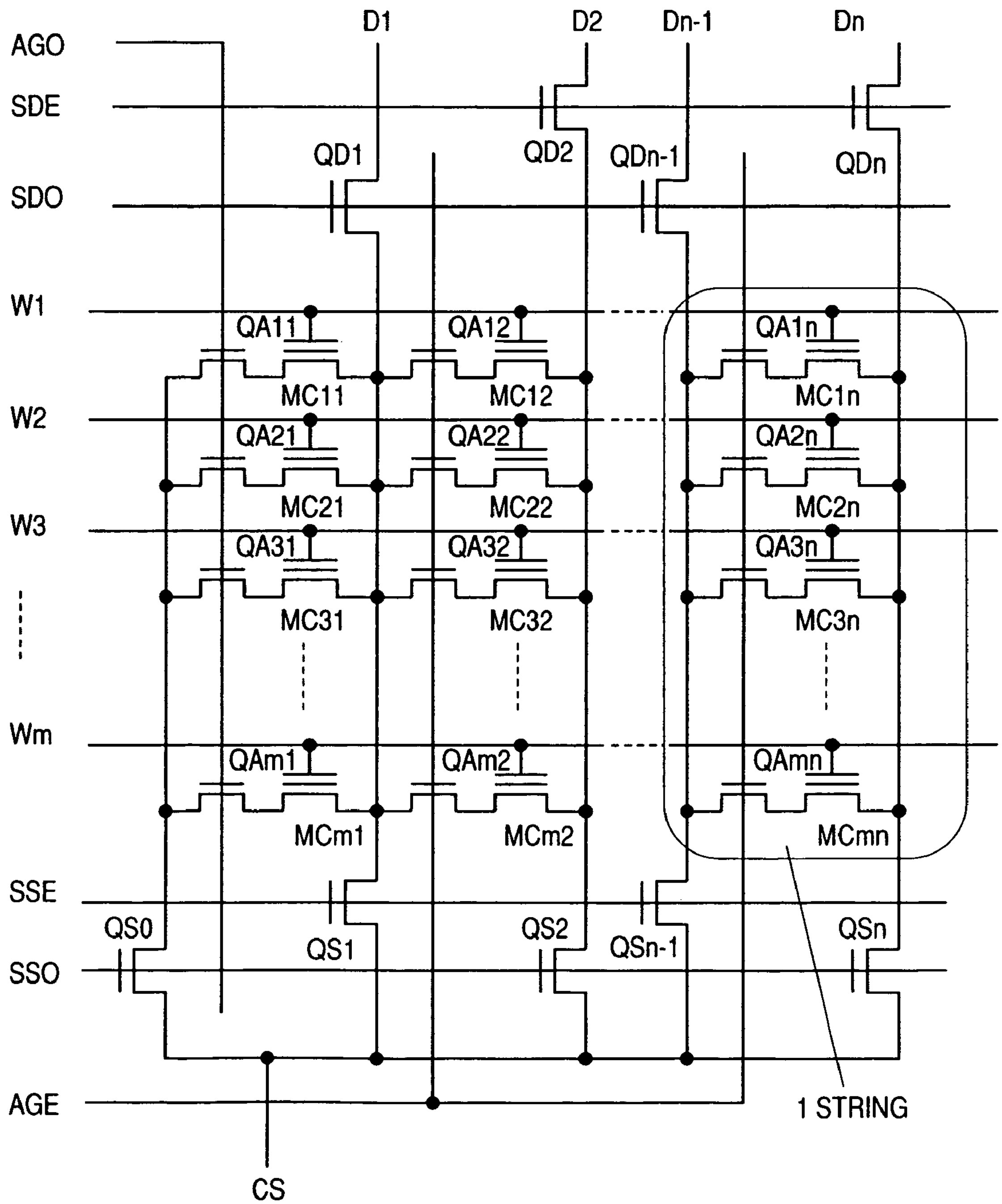
FIG. 2 is a circuit diagram showing the essential part of a memory array in the flash memory embodying the invention.

FIG. 2 shows on block in the memory array. This block consists of a part each of different banks, and is organized in units each comprising a plurality of strings. Each string is organized in units each comprising a plurality of memory cells of a memory row connected to bit lines.

In a memory array, a plurality of strings are arranged in parallel in the direction of word lines in each block. On each string, a plurality of memory cells are connected in parallel and arranged in the direction of bit lines. Here is shown a case in which each block consists of m word lines W1 through Wm, n bit lines D1 through Dn, n strings and m×n memory cells MC11 through MCmn. Thus m memory cells are arranged per string.

For instance, in a memory row consisting of m memory cells MC11 through MCm1 of one string, the gates of the memory cells MC11 through MCm1 are respectively connected to word lines W1 through Wm; their drains are commonly connected to a local drain line, connected to a bit line D1 via a drain-side selected MOSFET QD1 driven by a signal on a drain-side control signal line SDO and connected to a common source line CS via a source-side selected MOSFET QS1 driven by a signal on a source-side control signal line SSE. The sources of the memory cells of this memory row are commonly connected via AGMOSFETs QA11 through QAm1 driven by a signal on a gate control signal line AGO and connected to the common source line CS via a source-side selected MOSFET QS0 driven by a signal on a source-side control signal line SSO.

In another memory row adjoining the above described memory row and consisting of memory cells MC12 through MCm2, the gates of the memory cell MC12 through MCm2 are connected to word lines W1 through Wrn; their drains are commonly connected to a local drain line, connected to a bit line D2 via a drain-side selected MOSFET QD2 driven by a signal on a drain-side control signal line SDE, and connected to the common source line CS via a source-side selected MOSFET QS2 driven by a signal on a source-side control signal line SSO. The sources of the memory cells of this memory row are commonly connected via AGMOSFETs QA12 through QAm2 driven by a signal on a gate control signal line AGE, connected to the bit line D1 via the drain-side selected MOSFET QD1 driven by a signal on the drain-side control signal line SDO, and also connected to the common source line CS via a source-side selected MOSFET QS1 driven by a signal on the source-side control signal line SSE.

Similarly, in any odd-numbered memory row, as in the aforementioned memory row consisting of the memory cells MC11 through MCm1, the memory cells MC are connected to word lines W and bit lines D, and further so connected as to be driven by signals on the drain-side control signal line SDO, the source-side control signal line SSE, the gate control signal line AGO and the source-side control signal line SSO. In any even-numbered memory row, as in the aforementioned memory row consisting of the memory cells MC12 through MCm2, the memory cells MC are connected to word lines W and bit lines D, and further so connected as to be driven by signals on the drain-side control signal line SDE, the source-side control signal line SSO, the gate control signal line AGE, the drain-side control signal line SDO and the source-side control signal line SSE.

In this memory array configuration, the word lines W1 through Wm are connected to the sub-decoders and the main decoder; on the basis of the results of decoding by these sub-decoders and main decoder, one word line W in each memory array is selected, and respectively prescribed voltages are applied to this selected word line W at the time of reading, writing and erasing data. Also at the time of read, write and erase operations, prescribed voltages are applied to the bit lines D, the drain-side control signal lines SDO and SDE, the source-side control signal lines SSE and SSO, and the gate control signal lines AGO and AGE in addition to the word lines, so that prescribed voltages be applied to the drains and sources of the memory cells MC.

Figure 3:
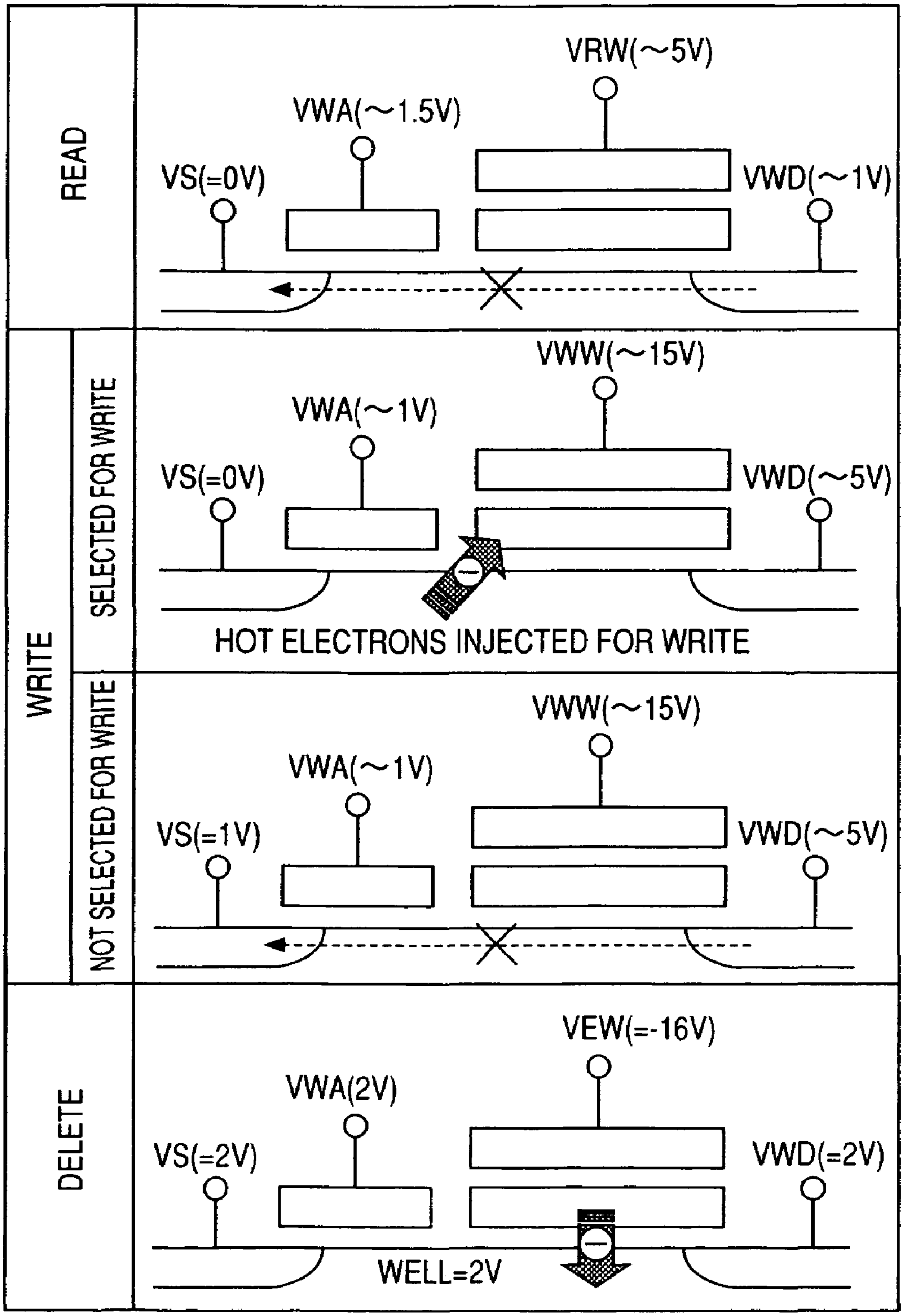
FIG. 3 illustrates the states of voltage application to memory cells in read, write and erase operations.

One example of the states of voltage application to memory cells in read, write and erase operations will be described with reference to FIG. 3.

In a read operation, a read voltage VRW (e.g. about 5 V) is applied to the word line W to which the selected memory cell MC is connected; the bit line D corresponding to the selected memory cell MC is precharged to a certain potential, such as a voltage VWD (e.g. about 1 V); the drain-side selected MOSFET QD on the local drain line to which the selected memory cell MC is connected and the source-side selected MOSFET QS corresponding to it are turned on; further a voltage VWA (e.g. about 1.5 V) is applied to the AGMOSFET QA to turn it on; and the voltage VS (e.g. about 0 V) of the common source line CS is applied to it.

In a write operation, a write voltage VWW (e.g. about 15 V) is applied to the word line W to which the selected memory cell MC is connected; the bit line D corresponding to the selected memory cell MC is precharged to a certain potential, such as a voltage VWD (e.g. about 5 V); the drain-side selected MOSFET QD on the local drain line to which the selected memory cell MC is connected and the source-side selected MOSFET QS corresponding to it are turned on; further a voltage VWA (e.g. about 1 V) is applied to the AGMOSFET QA to turn it on; and the voltage VS (e.g. 0 V) of the common source line CS is applied to it. In this way, a tunnel current is generated by charging the control gate with a high-voltage, and the threshold voltage is raised to a high level by injecting hot electrons into the floating gate. Incidentally, for unselected memory cells MC, a voltage VS (e.g. 1 V) is applied to the common source line CS.

In an erase operation, by applying an erase voltage VEW (e.g. −16 V) to the word lines W selected for erasure, collective line-by-line erasure is made possible. To add, in a data erase operation, the drain-side selected MOSFET QD and the source-side selected MOSFET QS of the block containing the word lines W selected for erasure are turned on; further, a voltage VWA (e.g. about 2 V) is applied to the AGMOSFET QA to turn in on; and a voltage VWD (e.g. 2 V) to the drains of the memory cells MC of the selected block while a voltage VS (e.g. 2 V) is applied to their sources. To the well region is applied 2 V at this time. By applying a negative voltage to the control gate in this way, the electric charge is drawn out of the floating gate with a tunnel current to achieve a state of a low threshold voltage.

An example of Y access circuit in the flash memory in this mode of implementation will be described with reference to FIG. 4. Y access circuits in the flash memory in this mode of implementation may be for example, though not limited to, what represent combined use of the so-called single end sense formula and the so-called NMOS gate-received sense formula. In the single end sense formula, a sense latch circuit is arranged at one end of global bit lines (bit lines), and the voltage on the global bit lines corresponding to the threshold voltage of memory cells is detected by this sense latch circuit. The NMOS gate-received sense formula causes the gate of an NMOSFET connected between the global bit lines and the sense latch circuit to receive data on the global bit line and drives the node of the sense latch circuit.

Figure 4:
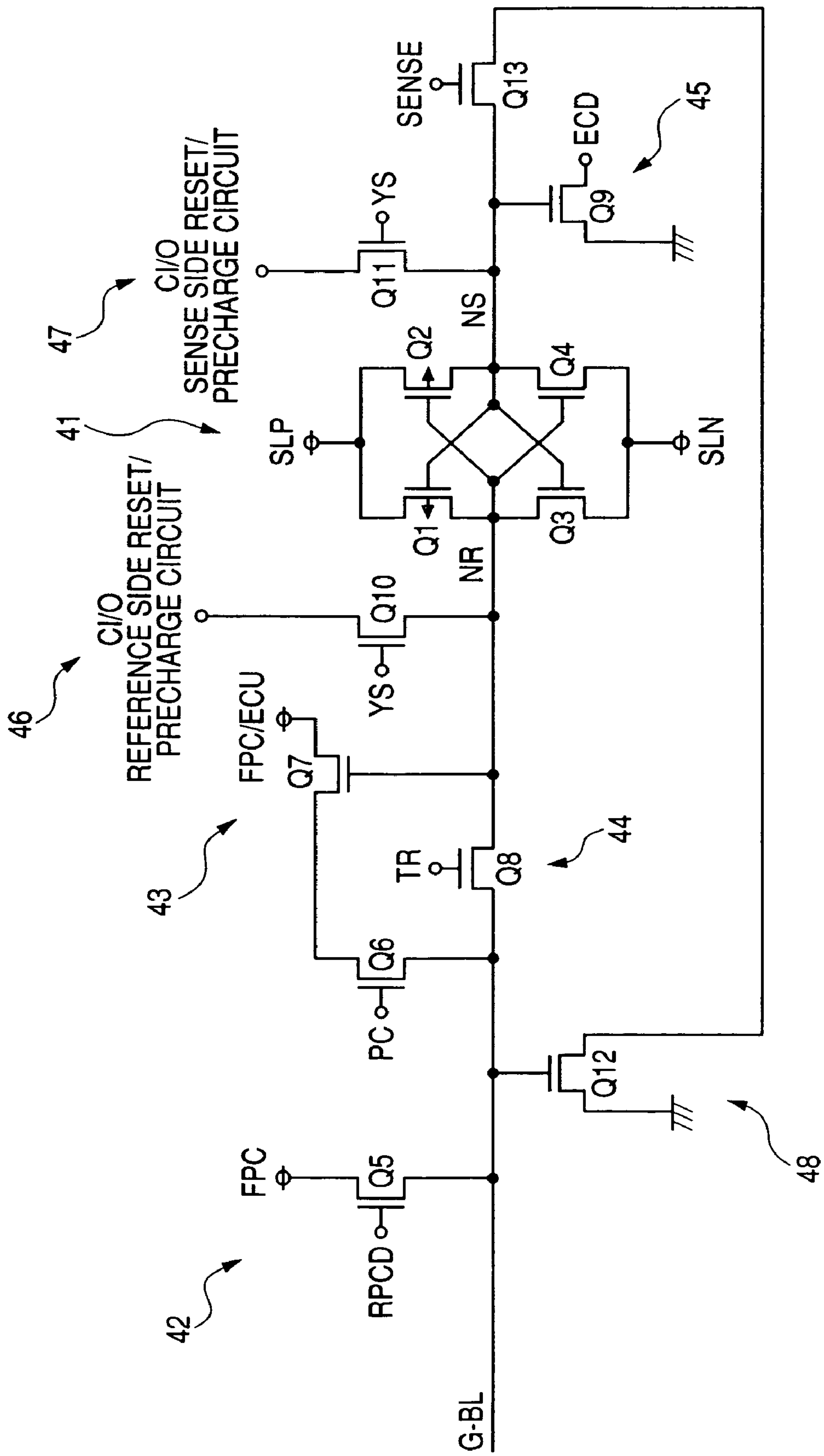
FIG. 4 is a circuit diagram showing a Y access circuit of a single end sense formula (NMOS gate-received sense formula)

As shown in FIG. 4, the Y access circuit which uses the single end sense formula and the NMOS gate-received sense formula in combination comprises a sense latch circuit 41, a global bit line precharge/discharge circuit 42 connected on the global bit lines leading to this sense latch circuit 41, a global bit line selective precharge/discharge all determination circuit 43, a transfer circuit 44, an all determination circuit 45, Y selection switch/sense latch node control circuits 46 and 47, and an NMOS gate-received sense circuit 48.

Incidentally, the global bit lines leading to the sense latch circuit 41 correspond to the bit lines shown in FIG. 2 referenced above. These global bit lines G-BL connect the memory cells and the sense latch circuit 41 via the drain-sides elected MOSFET driven by signals on the drain-side control signal lines SDO and SDE and the source-side selected MOSFET driven by signals on the source-side control signal lines SSE and SSO as shown FIG. 2. As their capacity per line is large, for instance about 0.3 pF, they can be used for temporary saving of memory cell data.

The sense latch circuit 41 is a circuit for sensing the threshold state of the memory cells, latching the data after this sensing and holding information on the memory cell to be written in. This sense latch circuit 41 has a latch type (gate-drain cross type) CMOS configuration consisting of two PMOSFETs Q1 and Q2 and two NMOSFETs Q3 and Q4, in which the higher potential side of the PMOSFETs Q1 and Q2 is connected to a signal line SLP and the lower potential side of the NMOSFETs Q3 and Q4 is connected to a signal line SNP. In the rest of the description and illustration, the sense latch circuit 41 may sometimes be abbreviated to SL.

The global bit line precharge/discharge circuit 42 is a circuit combining the function of collectively precharging the global bit lines G-BL and that of collectively discharging the global bit lines G-BL. This global bit line precharge/discharge circuit 42 consists of one NMOSFET Q5, which is connected between the global bit lines G-BL and a signal line FPC and whose gate is connected to and driven by a signal line RPCD. The collective precharging/collective discharging operations of these global bit lines G-BL will be described afterwards with reference to FIG. 5.

The global bit line selective precharge/discharge all determination circuit 43 is a circuit combining the function of selectively precharging/discharging global bit lines G-BL line by line and that of determining all the data latched by the sense latch circuit 41. This global bit line selective precharge/discharge all determination circuit 43, configured by connecting two NMOSFETs Q6 and Q7, is connected between the global bit lines G-BL and the signal lines FPC/ECU; the gate of one NMOSFET Q6 is connected to and driven by a signal line PC, while that of the other NMOSFET Q7 is connected to and driven by the global bit lines G-BL. These operations to selectively precharge/discharge the global bit lines G-BL will be described afterwards with reference to FIG. 5.

Further, this global bit line selective precharge/discharge all determination circuit 43 turns on the NMOSFET Q6 with a signal on the signal line PC, supplies an ECU potential to the signal lines FPC/ECU, turns on the NMOSFET Q5 with a signal on the signal line RPCD of the global bit line precharge/discharge circuit 42, and supplies a VSS potential to the signal line FPC; then the voltage level, "H" or "L", of nodes NR of the sense latch circuit 41, to which the gate of the NMOSFET Q7 can be determined.

The transfer circuit 44 is a circuit for connecting or disconnecting the sense latch circuit 41 and global bit lines G-BL. This transfer circuit 44 consists of one NMOSFET Q8, and is connected to the global bit lines G-BL and one node NR (on the global bit line side) of the sense latch circuit 41, with its gate being connected to a signal line TR to be driven. In this transfer circuit 44, the NMOSFET Q8 is turned on with a signal on the signal line TR, and can be used in supplying a write select/obstruct voltage. The source of this write select/obstruct voltage is the potential of the signal line SLP on the high potential side or the potential of the signal line SNP on the low potential side of the sense latch circuit 41.

The all determination circuit 45 is a circuit for determining all the data latched by the sense latch circuit 41. This all determination circuit 45, consisting of one NMOSFET Q9, is connected between a signal line ECD and the ground potential, its gate being connected to the other node NS (the other side than the global bit lines) of the sense latch circuit 41. This all determination circuit 45 can determine the voltage level, "H" or "L", of nodes NS of the sense latch circuit 41 to which the gate of the NMOSFET Q9 is connected.

The Y selection switch/sense latch node control circuits 46 and 47 are circuits combining a switching function for inputting/outputting data between the sense latch circuit 41 and a common input/output line CI/O and a function to reset/preset the nodes of the sense latch circuit 41. These Y selection switch/sense latch node control circuits 46 and 47 consist of two NMOSFETs Q10 and Q11 connected to the nodes NR and NS on the two sides of the sense latch circuit 41. For instance one NMOSFET Q10, which is on the reference side, is connected between one node NR of the sense latch circuit 41 and the common input/output line CI/O, its gate is connected to a signal line YS to be driven. The other NMOSFET Q11, which is on the sense side for instance, is connected between the other node NS of the sense latch circuit 41 and the common input/output line CI/O, and its gate is connected to the signal line YS to be driven. A signal on the signal line YS turns on the NMOSFETs Q10 and Q11 to enable data to be exchanged between the SRAMs and the sense latch circuit 41. The signal on the signal line YS is entered from a Y address decoder.

These Y selection switch/sense latch node control circuits 46 and 47 turn on the NMOSFETs Q10 and Q11 with a signal on the signal line YS. When they supply a VCC potential to the common input/output line CI/O, the nodes of the sense latch circuit 41 can be precharged or, when they supply a VSS potential to the common input/output line CI/O, the nodes of the sense latch circuit 41 can be discharged. The discharging function is used for clearing the sense latch circuit 41 of data.

The NMOS gate-received sense circuit 48 is a circuit combining a sensing function and the function of placing the nodes of the sense latch circuit 41 in a state in which a sufficient quantity of signals is secured in order to prevent the sense latch circuit 41 from acting erroneously. This NMOS gate-received sense circuit 48, configured by connecting two NMOSFETs Q12 and Q13, connected between the other node NS of the sense latch circuit 41 and the ground potential. The gate of one NMOSFETQ 12 is connected to the global bit lines G-BL to be driven, while the gate of the other NMOSFET Q13 is connected to a signal line SENSE to be driven. This NMOS gate-received sense circuit 48 turns on the NMOSFET Q13 on with a signal on the signal line SENSE, and can sense the potential of the global bit lines G-BL to which the gate of the NMOSFET Q12 is connected. When the NMOSFET Q13 is open, it senses "H" when the global bit lines G-BL are at "H" or senses "L" when the global bit lines G-BL are at "L".

Figure 5:
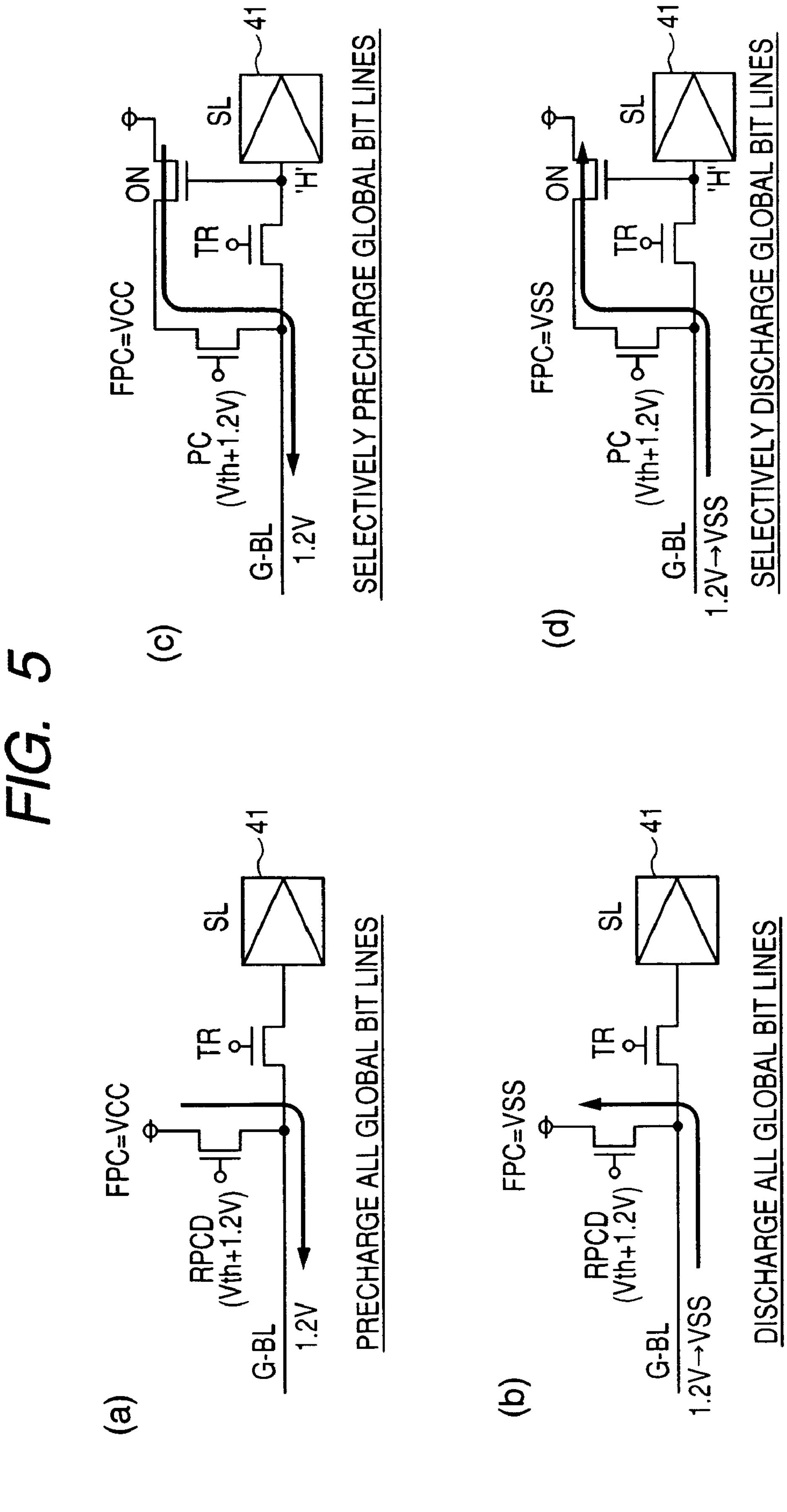
FIGS. 5(*a*) through 5(*d*) illustrate precharge/discharge operations on global bit lines.

One example of precharging/discharging of global bit lines will be described with reference to FIGS. 5(*a*) to 5(*d*), wherein FIG. 5(*a*) total precharging; FIG. 5(*b*), total discharging; FIG. 5(*c*), selective precharging; and FIG. 5(*d*), selective discharging.

As shown in FIG. 5(*a*), total precharging of global bit lines is made possible by the global bit line precharge/discharge circuit 42 when it sets the potential of the signal line FPC supplying the source voltage to another potential than VCC/VSS. Thus, a VCC potential is supplied to the signal line FPC, the MOSFET Q5 is turned on with a signal on the signal line RPCD, and the global bit lines G-BL are collectively precharged. For instance when the potential of the signal line RPCD is set to (Vth+1.2 V), the global bit lines are precharged to 1.2 V.

As shown in FIG. 5(*b*), total discharging of global bit lines is accomplished by the global bit line precharge/discharge circuit 42 when it supplies a VSS potential to the signal line FPC, turns on the MOSFET Q5 with a signal on the signal line RPCD, and the global bit lines G-BL are collectively discharged. For instance when the potential of the signal line RPCD is set to (Vth+1.2 V), the global bit lines are discharged from 1.2 V to VSS.

As shown in FIG. 5(*c*), selective precharging of global bit lines is made possible by the global bit line selective precharge/discharge all determination circuit 43 when it sets the potential of the signal line FPC supplying the source voltage to other potential than VCC/VSS. Incidentally, as the nodes of the sense latch circuit 41 (SL) are at an "H" voltage level at the time of selection, the MOSFET is on. Thus a VCC potential is supplied to the signal line FPC to turn on the MOSFETQ with a signal on the signal line PC and global bit lines G-BL are selectively precharged. For instance, when the potential of the signal line PC is set to (Vth+1.2 V), the global bit lines are precharged to 1.2 V.

As shown in FIG. 5(*d*), selective discharging of global bit lines is accomplished by the global bit line selective precharge/discharge all determination circuit 43 when it supplies a VSS potential to the signal line FPC, turns on the MOSFETQ under drive by the signal line PC, and global bit lines G-BL are selectively discharged. For instance when the potential of the signal line PC is set to (Vth+1.2 V), the global bit lines are discharged from 1.2 V to VSS.

One example of data transfer circuit in the flash memory in this mode of implementation will be described with reference to FIG. 6. The data transfer circuit in the flash memory in this mode of implementation may have, though not limited to, a so-called 1×sense latch circuit+2×SRAM configuration.

Figure 6:
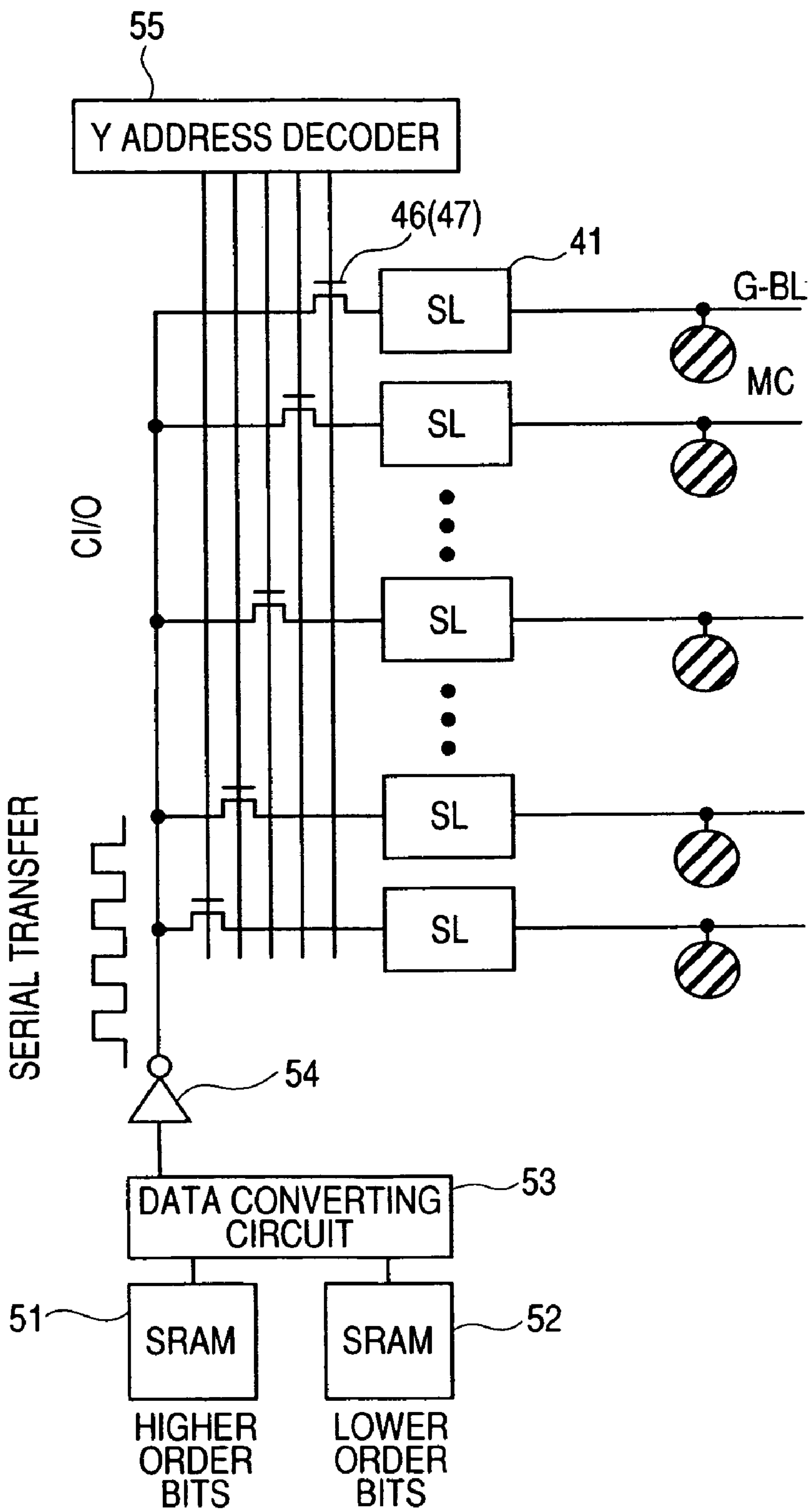
FIG. 6 is a configurational diagram showing a data transfer circuit.

As shown in FIG. 6, the data transfer circuit using the 1×sense latch circuit+2×SRAM configuration comprises the sense latch circuit 41 (SL) arranged at one end of global bit lines G-BL to which memory cells MC are connected; the common input/output line CI/O to which each node of this sense latch circuit 41 is connected via the NMOSFET of the Y selection switch/sense latch node control circuit 46 (47); SRAMs 51 and 52 for storing higher order bits and lower order bits, respectively, of write data; a data converting circuit 53 connected to these SRAMs 51 and 52; and a main amplifier 54 connected between this data converting circuit 53 and the common input/output line CI/O. Incidentally, the NMOSFET of the Y selection switch/sense latch node control circuit 46 (47) is driven according to the result of decoding by the Y address decoder 55.

In this data transfer circuit, two SRAMs 51 and 52 are allocated to each of the plurality of sense latch circuits 41 in each bank, and data of higher order bits and lower order bits stored in each pair of SRAMs 51 and 52 are selected by the data converting circuit 53 and, after being converted from multi-value into two-value forms, serially transferred to the common input/output line CI/O via the main amplifier 54. Further, each set of two-value data transferred serially are held by each sense latch circuit 41, and written into individual memory cells MC.

For instance, sets of two-bit data (generally write data) entered through a data input/output terminal are stored bit by bit into the two SRAMs 51 and 52. When data are to be transferred serially from these two SRAMs 51 and 52 to the sense latch circuit 41 via the common input/output line CI/O, any desired one of four sets of two-bit data ("00", "10", "11" and "01") can be selectively transferred. Where "11" is to be transferred, only "11" is transferred as "H" data and others are transferred as "L" data.

To add, in this data transfer circuit, at the time of reading, read data は from individual memory cells MC are held by each sense latch circuit 41 and further transferred from the sense latch circuit 41 to the SRAMs 51 and 52, where they are stored, divided into higher order bits and lower order bits, respectively, of data.

One example of data synthesizing circuit for the higher order bits and lower order bits stored in the SRAMs will be described with reference to FIG. 7 and FIG. 8.

Figure 7:
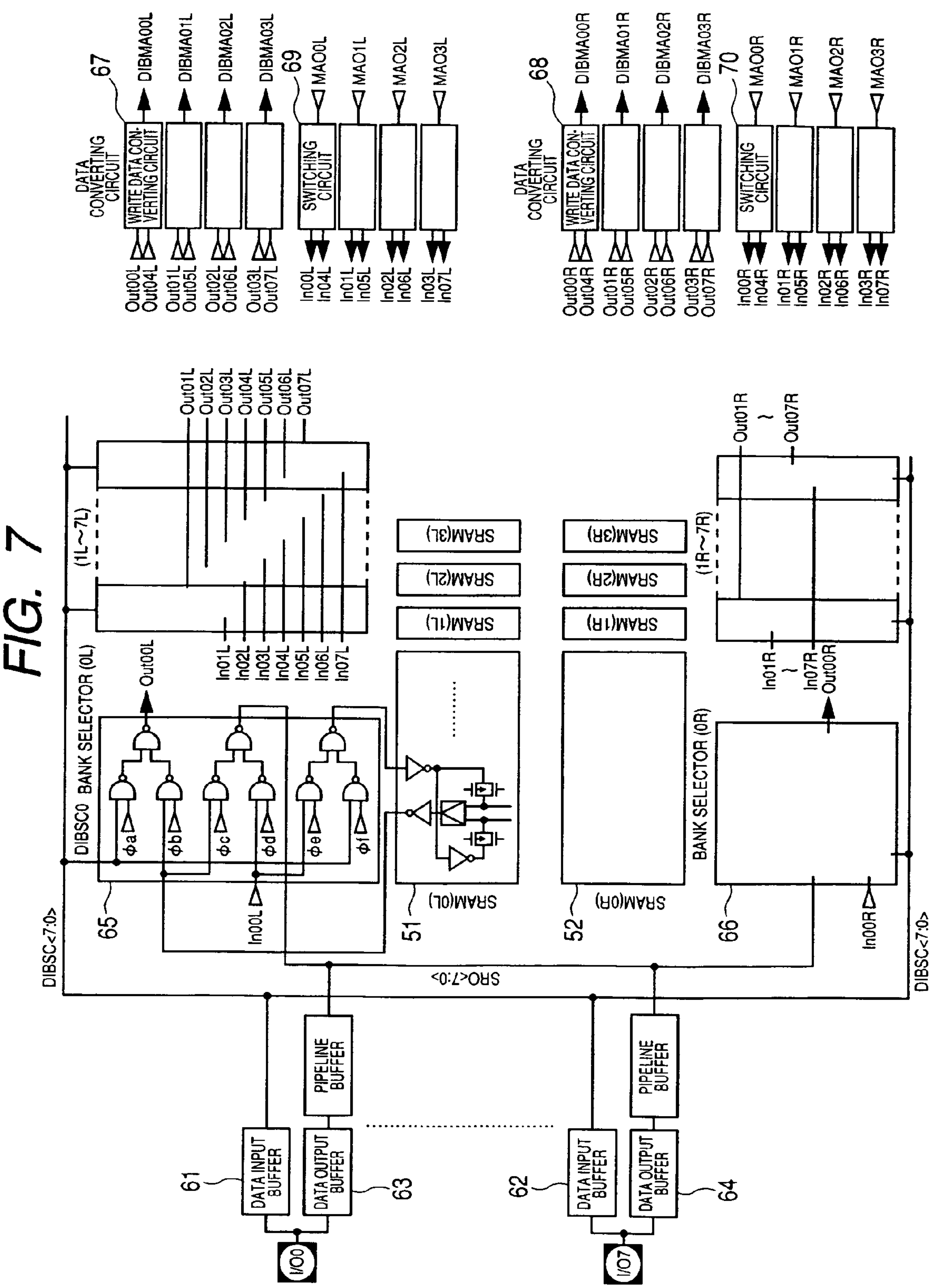
FIG. 7 is a circuit diagram showing a data synthesizing circuit.
Figure 8:
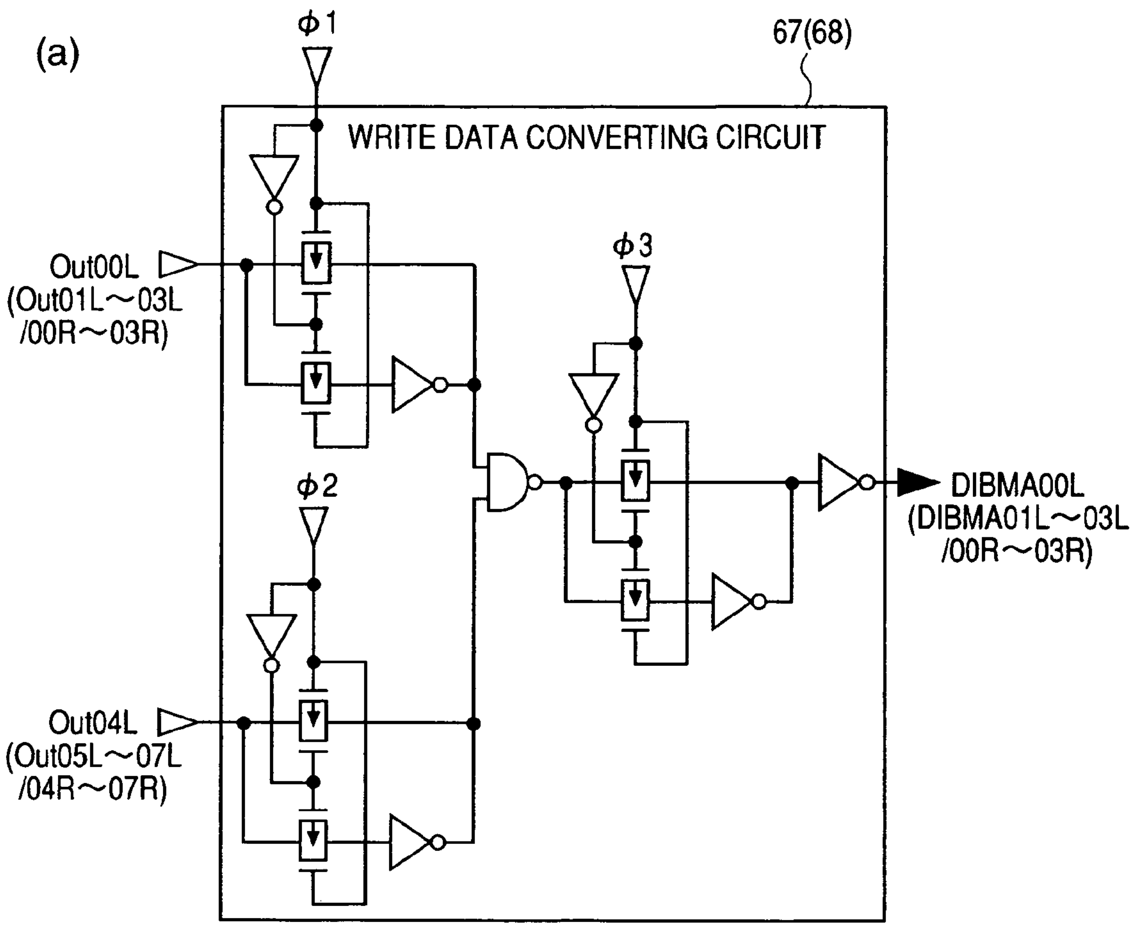
FIGS. 8(*a*) and 8(*b*) are circuit diagrams showing a write data converting circuit and a switching circuit, respectively.
Figure 8:
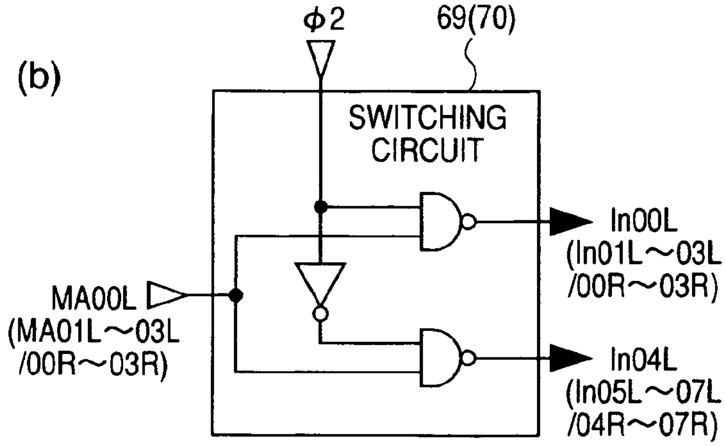

As shown in FIG. 7, the data synthesizing circuit comprises bank selectors 65 and 66 connected to data input buffers 61 and 62 and data output buffers 63 and 64 leading to the data input/output terminal I/O, the SRAMs 51 and 52 connected to these bank selectors 65 and 66, and the data converting circuit 53 connected to the bank selectors 65 and 66 among other elements. The data converting circuit 53 comprises write data converting circuit 67 and 68 and switching circuits 69 and 70.

In this data synthesizing circuit, two bank selectors 65 (66), one write data converting circuit 67 (68) and one switching circuit 69 (70) are allocated to each SRAM 51 (52), operating in a mode of operation selected by the bank selectors 65 (66) each consisting of a plurality of NAND gates. Further, a selection mode for write data conversion is set by the write data converting circuit 67 (68) consisting of a plurality of pass gates, a NAND gate and an inverter, shown in FIG. 8(*a*), and a mode for selection of higher order data and lower order data is set by the switching circuit 69 (70) consisting of a NAND gate and an inverter, shown in FIG. 8(*b*).

For operating mode selection, an operating mode is selected by each of the bank selectors 0L (1L through 7L/0 through 7R) in accordance with control signals ϕa through ϕe with signals on signal lines DIBSC0 (DIBSC1 through DIBSC7) and on signal line In00L (In01L through In07L/In00R through In07R) being used as inputs, and outputted by way of signal lines Out 00L (Out01L through Out07L/Out00R through Out07R). The choice of operating modes includes, for example, transfer from the data input/output terminal to the SRAM/sense latch circuit, transfer from the data input/output terminal to the SRAM, transfer from the SRAM to the sense latch circuit, transfer from the sense latch circuit to the SRAM, transfer from the sense latch circuit to the data input/output terminal, and transfer from the SRAM to the data input/output terminal.

For write data conversion, each of the write data converting circuits 0L (1L through 3L/0R through 3R) selects write data conversion in accordance with control signals ϕ1 through ϕ3 with signals on signal lines Out00L, Out04L (Out01L through Out03L and Out05L through Out07L/Out00R through Out07R) as inputs, and outputted by way of signal lines DIBMA00L (DIBMA01L through DIBMA03L/DIBMA00R through DIBMA03R). Incidentally, a signal line DIBMA* leads to the main amplifier 54. In this write data conversion, for example, when writing "01", "01" (the higher order of the input/output terminal is "0" and the lower order is "1") data are converted into an output (DIBMA*) "0", all others than "01" into "1", and "00" treated in the same way as in writing "10".

In choosing higher order data and lower order data, each of the switching circuits 0L (1L through 3L/0R through 3R) selects the transfer of higher order data and lower order data in accordance with a control signal ϕ4 with signals on signal lines MA00L (MA01L through MA03L/MA00R through MA07R) as inputs, and the selection is outputted by way of the signal lines In00L and In04L (In01L through In03L, In05L through In07L/In00R through In07R). Incidentally, a signal line MA* leads to the main amplifier 54. In this choice of higher order data and lower order data, the level is "H" when transferring higher order data or "L" when transferring lower order data, and higher order data are transferred to the data input/output terminals I/O4 through I/O7 of the SRAMs via signal lines In*4 through In*7 while lower order data are transferred to the data input/output terminals I/O0 through I/O3 of the SRAMs via signal lines In*0 through In*3.

One example of read operation in the flash memory in this mode of implementation will be described with reference to FIG. 9 through FIG. 11. This read operation may be accomplished in, though not limited to, for instance in the multi-value (four-value) read mode shown in FIG. 9 or in the two-value read mode shown in FIG. 10.

Figure 11:
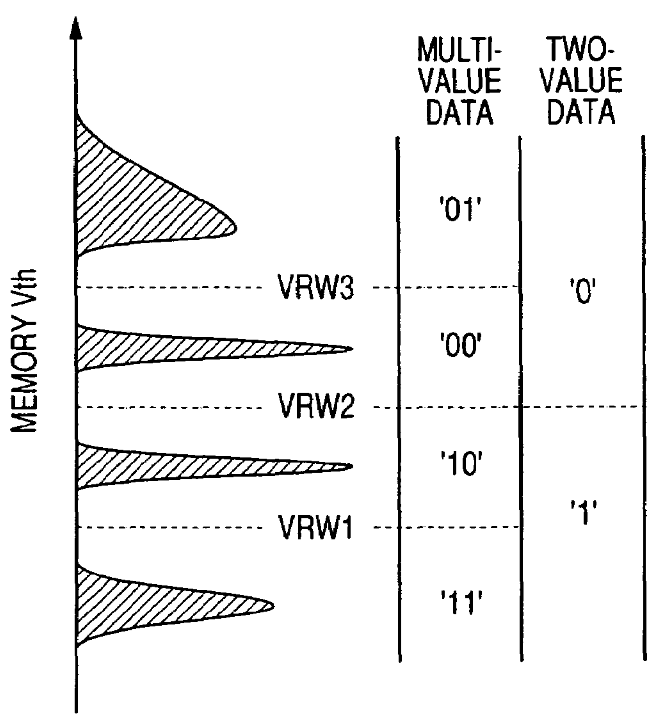
FIG. 11 illustrates the relationship between the threshold voltage distribution and the read voltage in memory cells.

In this read mode, the relationship between the threshold voltage distribution and the read voltage of memory cells as illustrated in FIG. 11. For multi-value data, a read voltage VRW1 is set between the distribution of "11" and that of "10", a read voltage VRW2, between the distribution of "10" and that of "00", and a read voltage VRW3, between the distribution of "00" and that of "01". For two-value data, a read voltage VRW2 set between the distribution of "1" and that of "0".

In this read mode, data computation is performed between the sense latch circuits 41 (SL) and global bit lines G-BL in the aforementioned 1×sense latch circuit+2×SRAM configuration, and data of higher order bits and lower order bits are once stored into the sense latch circuits 41. Further, the read data stored in the sense latch circuits 41 are transferred to the SRAMs 51 and 52, separated between higher order bits and lower order bits. In this transfer, out of two-bit data, lower order bit data are synthesized. And the read data stored in the SRAMs 51 and 52 are supplied to the data input/output terminal I/O in synchronism with external serial clocks. Details will be sequentially described below with reference to FIG. 9 and FIG. 10.

Figure 9:
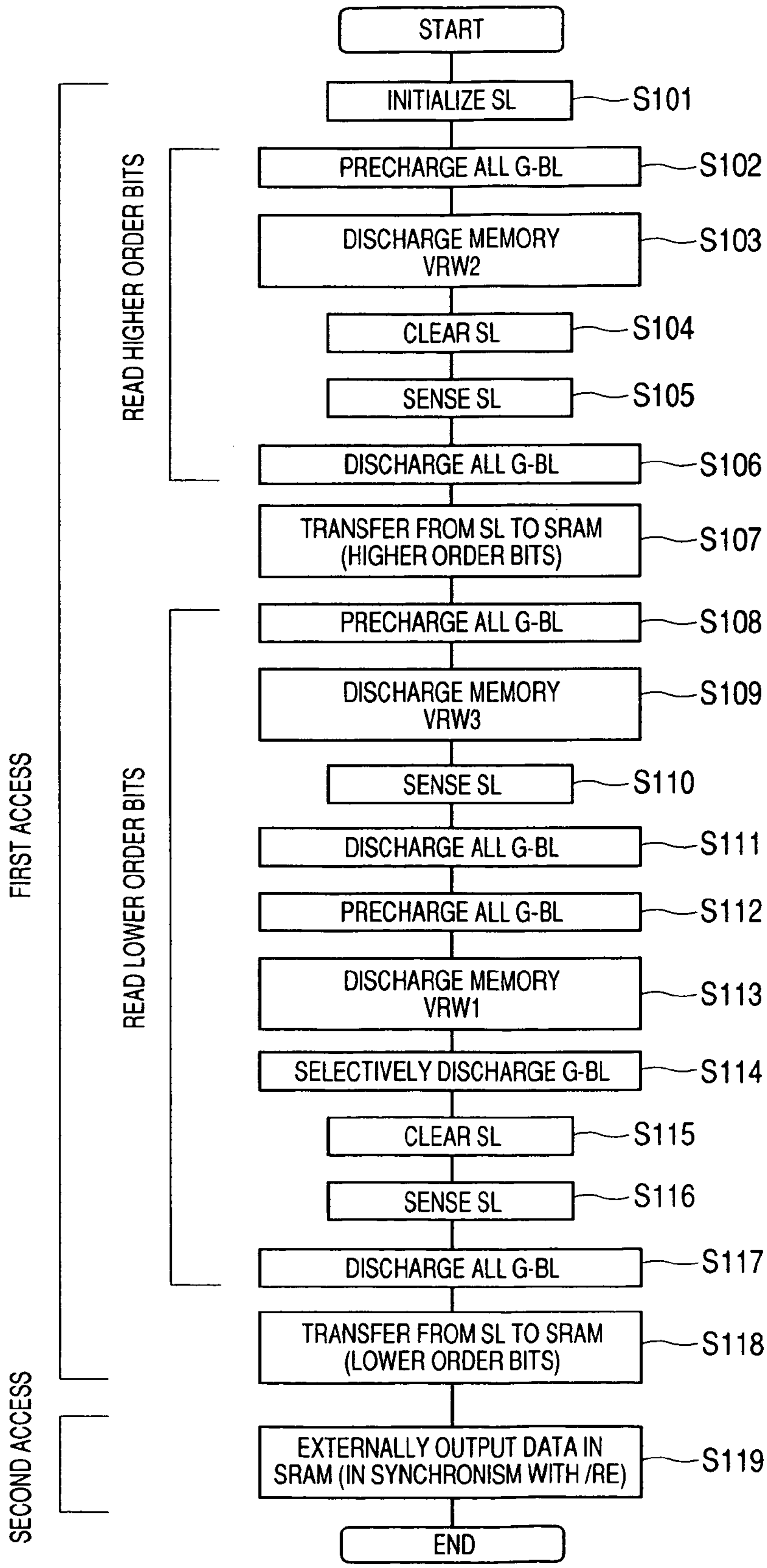
FIG. 9 is a flow chart showing a multi-value read mode.

As shown in FIG. 9, the multi-value read mode comprises first access processing and second access processing. In the first access processing, after each sense latch circuit is initialized (step S101), higher order bits are read, higher order bits are transferred, lower order bits are read and lower order bits are transferred in this sequence.

(1) In the first access processing, to read higher order bits, after precharging all the global bit lines, memory cells are discharged (steps S102 and S103). In this discharge of memory cells, a read voltage VRW2 is applied to word lines leading to the selected memory cells.

And after the nodes of the sense latch circuit are cleared, the sense latch circuit senses data on the global bit lines, and holds these data in the sense latch circuit (steps S104 through S106). After that, all the global bit lines are discharged.

(2) To transfer higher order bits, the data held in the sense latch circuit are transferred to the SRAM, and these data are stored into the SRAM (step S107). At this step, the data are stored into the SRAM for higher order bits as data of higher order bits.

(3) To read lower order bits, as in the reading of higher order bits described above, after precharging all the global bit lines, discharging memory cells (VRW31) and clearing the sense latch circuit in this sequence, all the global bit lines are discharged. After that, precharging of all the global bit lines, discharging of memory cells (VRW1), selective precharging of global bit lines, clearing of the sense latch circuit, sensing by the sense latch circuit and discharging of all the global bit lines are performed in this sequence (steps S108 through S117).

(4) To transfer lower order bits, as in the transfer of higher order bits described above, the data held in the sense latch circuit are transferred to and stored into the SRAM (for lower order bits) (step S118).

(5) In the second access processing, the data stored in the SRAMs are externally outputted. At this step, the read data are outputted in synchronism with a read enable control signal/RE (step S119).

Figure 10:
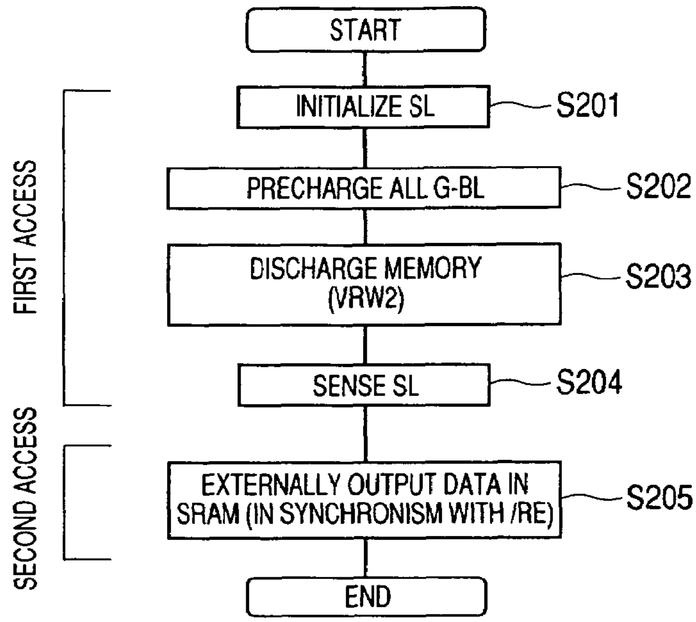
FIG. 10 is a flow chart showing a two-value read mode.

As shown in FIG. 10, in the two-value read mode there are the first access processing and the second access processing. Incidentally in the two-value read mode, the four least significant bits are F-fixed, and read data are outputted to the four most significant bits.

(1) In the first access processing, after initializing the sense latch circuit, all the global bit lines are precharged, followed by discharging of selected memory cells by applying a read voltage VRW2 to word lines leading to the selected memory cells (steps S201 through S203). Then, data on the global bit lines are sensed by the sense latch circuit, and these data are held in the sense latch circuit (step S204).

(2) In the second access processing, the data held in the sense latch circuit are outputted externally as read data in synchronism with the enable control signal/RE (step S205).

An example of write operation in the flash memory in this mode of implementation will be described with reference to FIG. 12 through FIG. 25. This write operation may be accomplished in, though not limited to, for example a high speed write mode shown in FIG. 12 through FIG. 14, a write mode with pre-verify shown in FIG. 15 through FIG. 17, a write mode from the lower voltage side shown in FIG. 18 and FIG. 19, and a write mode using simplified upper limit determination shown in FIG. 20 through FIG. 25.

Figure 14:
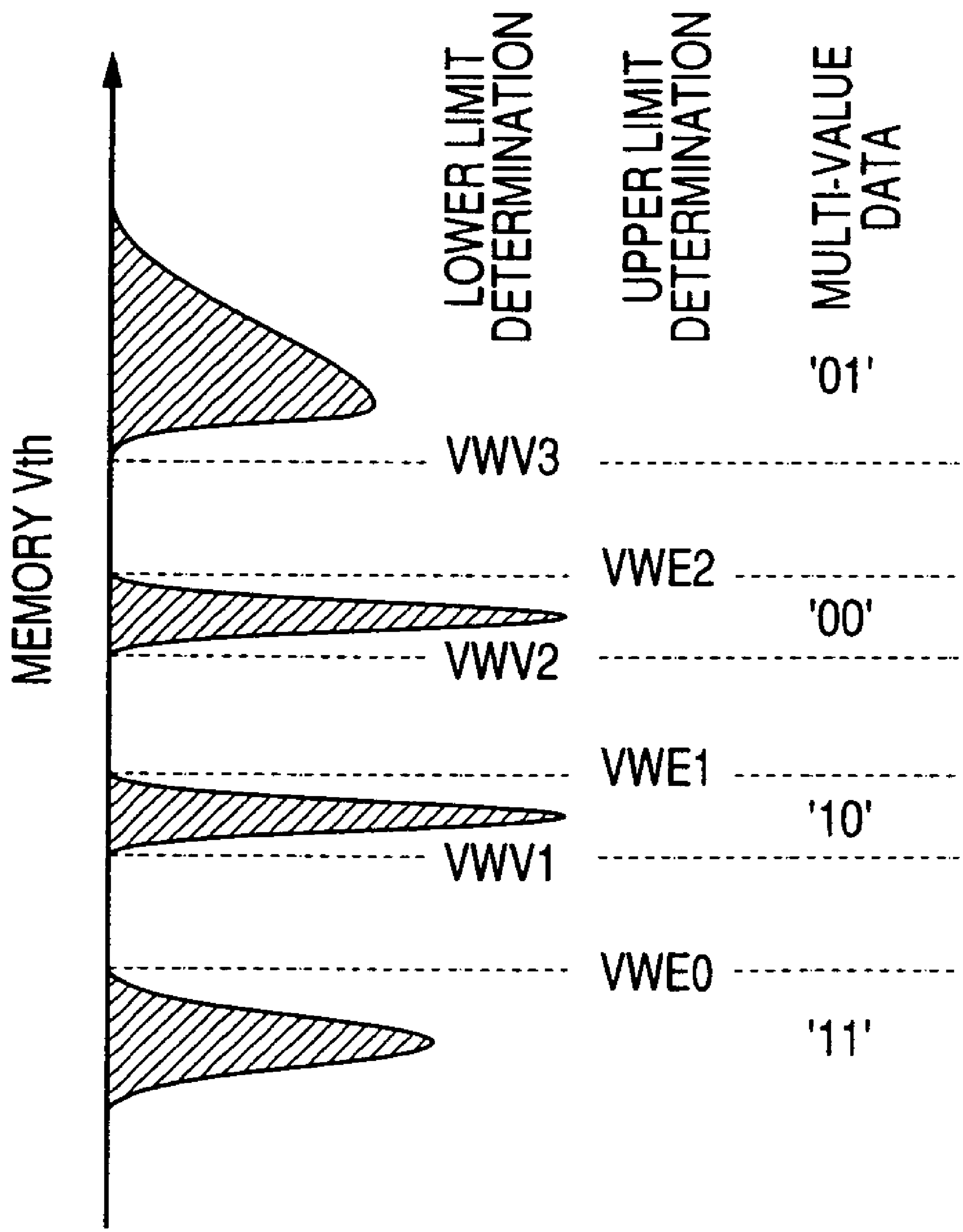
FIG. 14 illustrates the relationship between the threshold voltage distribution and the write voltage.

In this write mode, the relationship among the threshold voltage distribution (write voltage), the upper limit determination voltage and the lower limit determination voltage of memory cells is as shown in FIG. 14. In the distribution of "11" of multi-value data, the upper limit determination voltage is set to VWEO; in the distribution of "10", the upper limit determination voltage, to VWE1 and the lower limit determination voltage to VWV1; in the distribution of "00", the upper limit determination voltage, to VWE2 and the lower limit determination voltage, to VWV2; and in the distribution of "01", the lower limit determination voltage, to VWV3.

In this write mode, in the aforementioned 1×sense latch circuit+2×SRAM configuration, two-bit write data are separated into higher order bits and lower order bits, and stored into the two SRAMs 51 and 52. At the time of writing the threshold voltage of each memory cell, data in the SRAMs 51 and 52 are synthesized and transferred to the sense latch circuit 41 (SL). In this transfer, "H" is transferred only for memory cells selected for write, and "L" for all others.

Writing the threshold voltage distribution of memory cells comprises "write biasing" by which a write voltage is applied to word lines and the threshold voltage of the memory cells selected for write is thereby raised, "write processing" consisting of repetition of "write verify" to determine whether or not the threshold voltage of the memory cells selected for write has risen to the desired level, and "upper limit determination processing" to check whether or not no excessive writing has been done. At the beginning of each of the write processing and the upper limit determination processing, write data transfer is processed. Details will be described below in due sequence with reference to FIG. 12 through FIG. 25.

Figure 12:
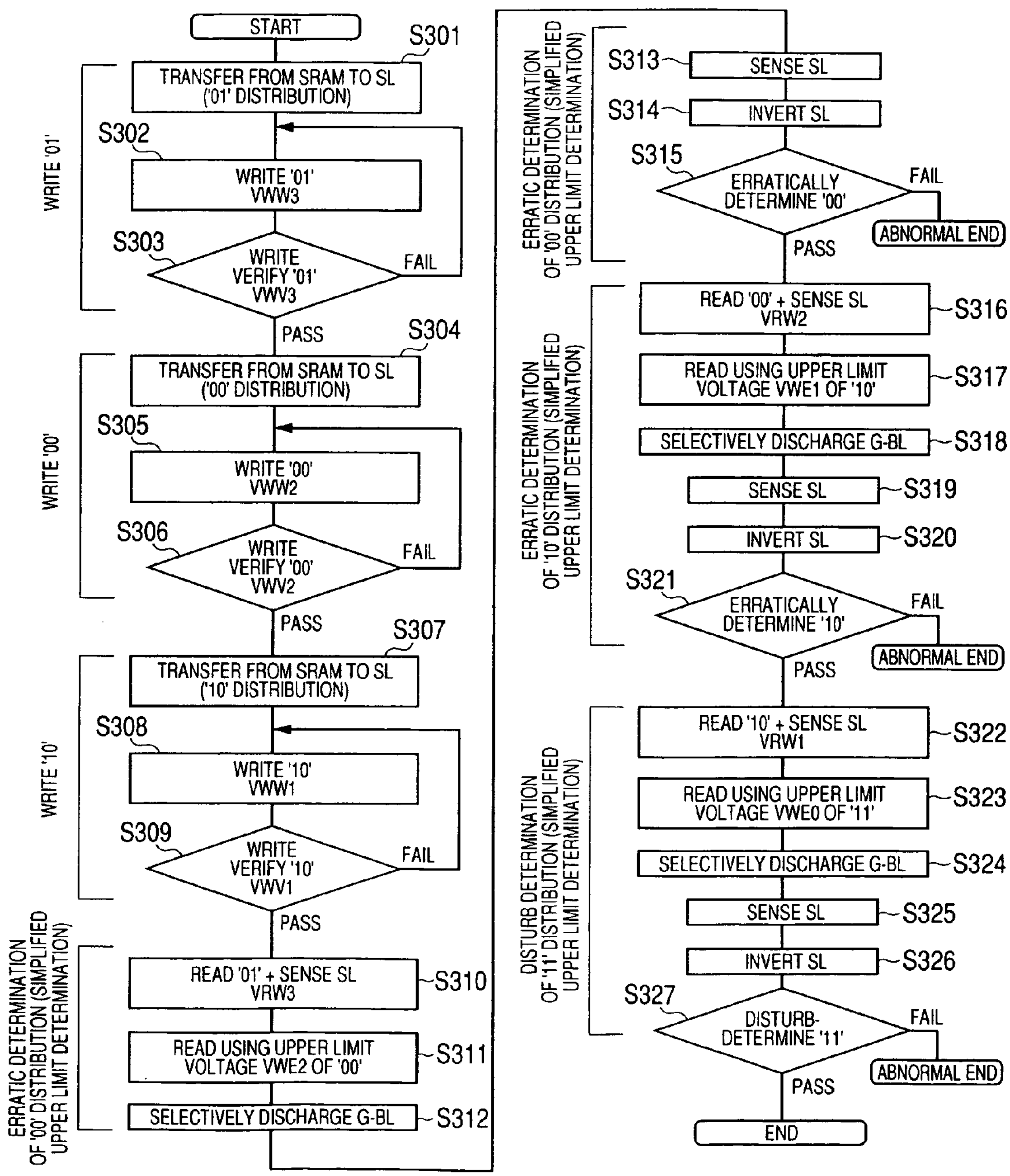
FIG. 12 is a flow chart showing a high speed write mode.

As shown in FIG. 12, in the high speed write mode with pre-verify, writing of "01" distribution, writing of "00" distribution, writing of "10" distribution, erratic determination (simplified upper limit determination) of "00" distribution, erratic determination (simplified upper limit determination) of "10" distribution and disturb determination (simplified upper limit determination) of "11" distribution are performed in this sequence.

(1) In the writing of "01" distribution, data stored in the SRAMs are transferred to the sense latch circuit and held by this sense latch circuit (step S301). At this step, the data of "01" distribution are transferred to the sense latch circuit.

And the "01" distribution is written into memory cells (step S302). At this step, a write voltage VWW3 corresponding to the "01" distribution is applied to word lines leading to the selected memory cells.

Following that, write verification of "01" distribution is performed (step S303). At this step, a write verify voltage VWV3 corresponding to the lower limit determination voltage of the "01" distribution is applied to word lines leading to the selected memory cells, and it is determined whether or not this write verify voltage VWV3 is surpassed. In this write verification of the "01" distribution, if the writing of the "01" distribution passes, a shift to the next processing will take place or, if it fails, the writing of the "01" distribution will be repeated until it passes. Incidentally, when a prescribed length of time elapses, all the bits are written up to an abnormal end.

Figure 13:
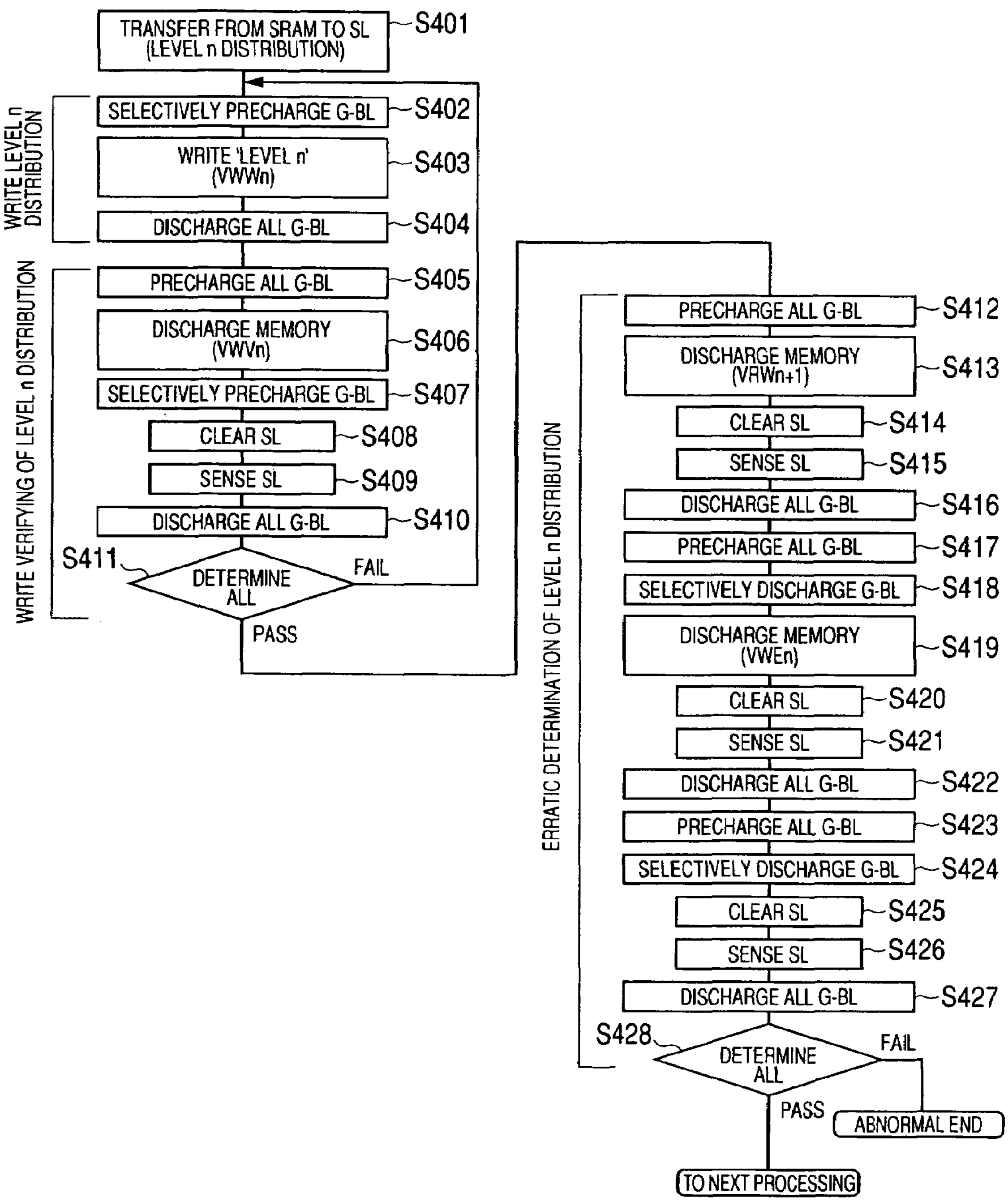
FIG. 13 is a flow chart showing details of write, write verify and erratic determination.

To go into further detail, as shown in FIG. 13, in writing level n distributions such as "01" distribution, "00" distribution to be described afterwards and "10" distribution, after data are transferred from the SRAMs to the sense latch circuit (step S401) and global bit lines are selectively precharged, a write voltage VWWn corresponding to the level n distribution is applied to word lines to write into memory cells, followed by discharging of all the global bit lines (steps S402 through S404).

In the write verification of a level n distribution, after all the global bit lines are precharged, a write verify voltage VWVn corresponding to the level n distribution is applied to word lines to discharge memory cells, followed by selective precharging of global bit lines (steps S405 through S407). And, after clearing the nodes of the sense latch circuit, the sense latch circuit are caused to sense data on the global bit lines, and those data are held in the sense latch circuit (steps S408 and S409). Then, after discharging all the global bit lines, all are determined (steps S410 and S411). In this total determination, it is determined, for instance, whether all the global bit lines are at "L" and, if they are, the process will shift to the next step or, if there is a global bit line of which any bit, even only one, is at "H", the processing from write is repeated.

(2) In the writing of "00" distribution, as in the writing of "01" distribution described above, transfer of data in the SRAMs to the sense latch circuit ("00" distribution), writing of "00" distribution into memory cells (VWW2) and write verification of "00" distribution (VWV2) are performed in this sequence (steps S304 through S306).

(3) In the writing of "10" distribution, as in the writing of "01" distribution described above, transfer of data in the SRAMs to the sense latch circuit ("10" distribution), writing of "10" distribution memory cells (VWW1) and write verification of "10" distribution (VWV1) are performed in this sequence (steps S307 through S309).

(4) In the erratic determination (simplified upper limit determination) of "00" distribution, "01" distribution is read, and the read data are sensed by the sense latch circuit and held in it (step S310). In this reading of "01" distribution, a read voltage VRW3 is applied to word lines.

And after reading the upper limit of "00" distribution, global bit lines are selectively discharged (steps S311 and S312). In this reading of the upper limit of "00" distribution, an upper limit determination voltage VWE2 is applied to word lines.

Then the data are sensed and held by the sense latch circuit and, after inverting these data, erratic determination of "00" distribution is performed (steps S313 through S315). In this erratic determination of "00" distribution, if the writing of the "00" distribution passes, a shift to the next processing will be done or, if it fails, the process will come to an abnormal end with the threshold voltage distribution being held as it is.

To go into further detail, as shown in FIG. 13, in erratic determination (simplified upper limit determination) of level n distributions such as "00" distribution and "10" distribution to be described afterwards, after all the global bit lines are precharged, a read voltage VRWn+1 corresponding to the level n+1 distribution is applied to word lines to discharge memory cells (steps S412 and S413). Then the nodes of the sense latch circuit are cleared and, after causing the sense latch circuit to sense data on global bit lines, all the global bit lines are discharged (steps S414 through S416). Then, all the global bit lines are precharged, and after selective discharging of global bit lines, an upper limit determination voltage VWEn corresponding to the level n distribution is applied to word lines to discharge the memory cells (steps S417 through S419). And the nodes of the sense latch circuit are cleared and, data on global bit lines are sensed and held by the sense latch circuit, all the global bit lines are discharged (steps S420 through S422). Then, all the global bit lines are precharged. And, after selectively discharging global bit lines, the nodes of the sense latch circuit are cleared, data on the global bit lines are sensed and held by the sense latch circuit (steps S423 through S426). After discharging all the global bit lines, total determination is performed (steps S427 and S428).

(5) In erratic determination (simplified upper limit determination) of "10" distribution, as in the erratic determination (simplified upper limit determination) of "00" distribution described above, reading of "00" distribution (VRW2), sensing by the sense latch circuit, reading of the upper limit of "10" distribution (VWE1), selective discharging of global bit lines, sensing by the sense latch circuit, inversion of data, and erratic determination of "11" distribution are performed in this sequence (steps S316 through S321).

(6) In disturb determination (simplified upper limit determination) of "11" distribution, as in the erratic determination (simplified upper limit determination) of "00" distribution described above, reading of "10" distribution (VRW1), sensing by the sense latch circuit, reading of the upper-limit of "11" distribution (VWE0), selective discharging of global bit lines, sensing by the sense latch circuit, and inversion of data are performed in this sequence, and disturb determination of "11" distribution is performed (steps S322 through S327). Incidentally in this disturb determination (simplified upper limit determination) of "11" distribution, word disturb determination is performed on the unselected sector side.

Figure 15:
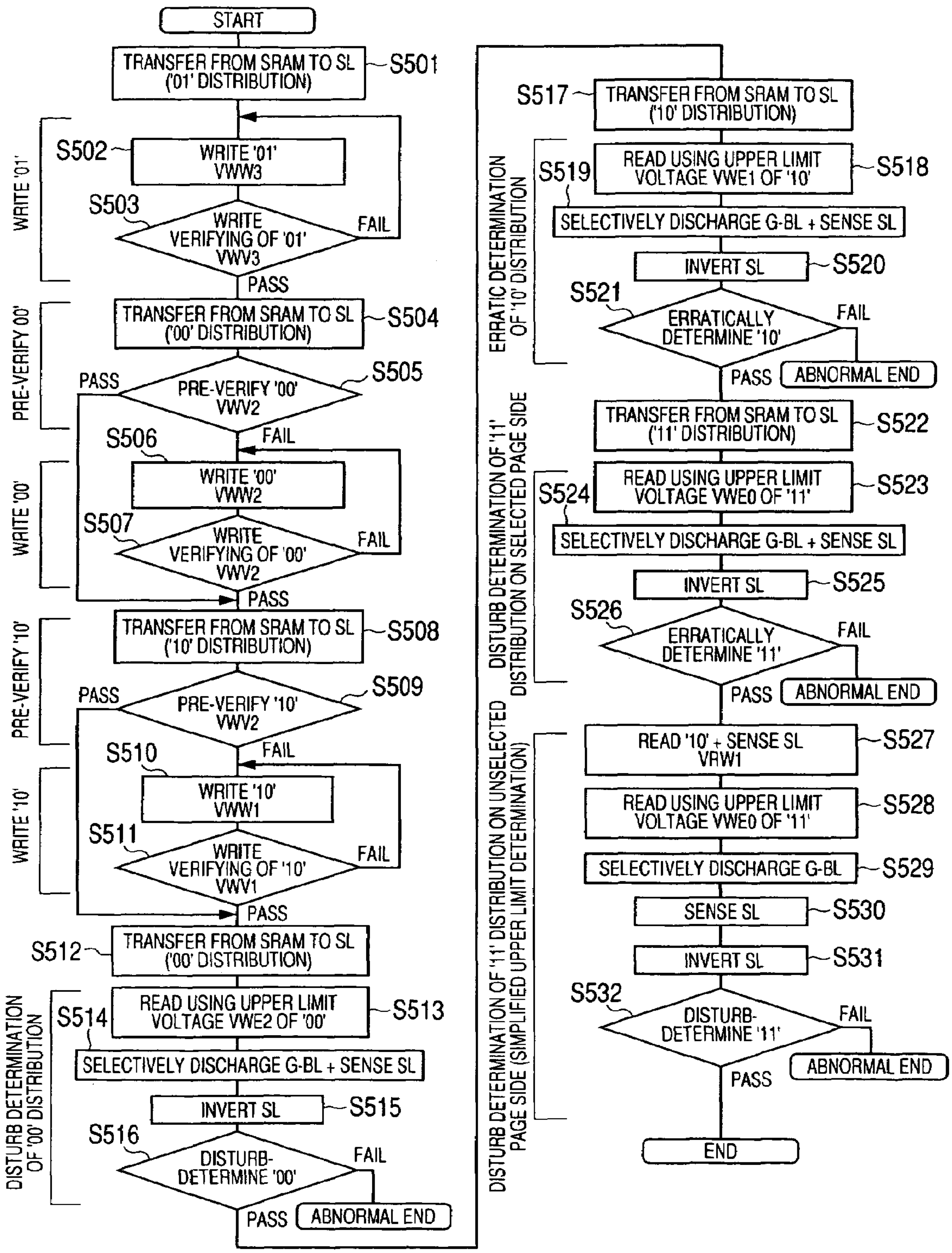
FIG. 15 is a flow chart showing a write mode with pre-verify.

As shown in FIG. 15, in the write mode with pre-verify, after data are transferred from the SRAMs to the sense latch circuit ("01" distribution), writing of "01" distribution, pre-verification of "00" distribution, writing of "00" distribution, pre-verification of "10" distribution, and writing of "10" distribution are performed in this sequence. And, after data are transferred from the SRAMs to the sense latch circuit ("00" distribution), disturb determination of "00" distribution is performed and, after data are further transferred from the SRAMs to the sense latch circuit ("10" distribution), erratic determination of "10" distribution are performed. After that, data are transferred from the SRAMs to the sense latch circuit ("11" distribution), and disturb determination of "11" distribution on the selected page side and disturb determination (simplified upper limit determination) of "11" distribution on the unselected page side are performed in this sequence.

(1) Since various data transfers from the SRAMs to the sense latch circuit ("01" distribution (step S501), "00" distribution (step S512), "10" distribution (step S517) and "11" distribution (step S522)) and the writing of "01" distribution (steps S502 and S503), "00" distribution (steps S506 and S507) and "10" distribution (steps S510 and S511) are performed in the same way in the high speed write mode with pre-verify described above, their description is omitted here.

(2) Pre-verification of "00" distribution is accomplished by applying, after transferring data of "00" distribution stored in the SRAMs to the sense latch circuit and having it held therein, a lower limit determination voltage VWV2 corresponding to the "00" distribution to word lines (steps S504 and S505). This pre-verification is processing to mask data in memory cells against write data to prevent excessive writing. Incidentally no pre-verification is applied to the writing of "01" distribution, to excessive writing would pose no problem.

Figure 16:
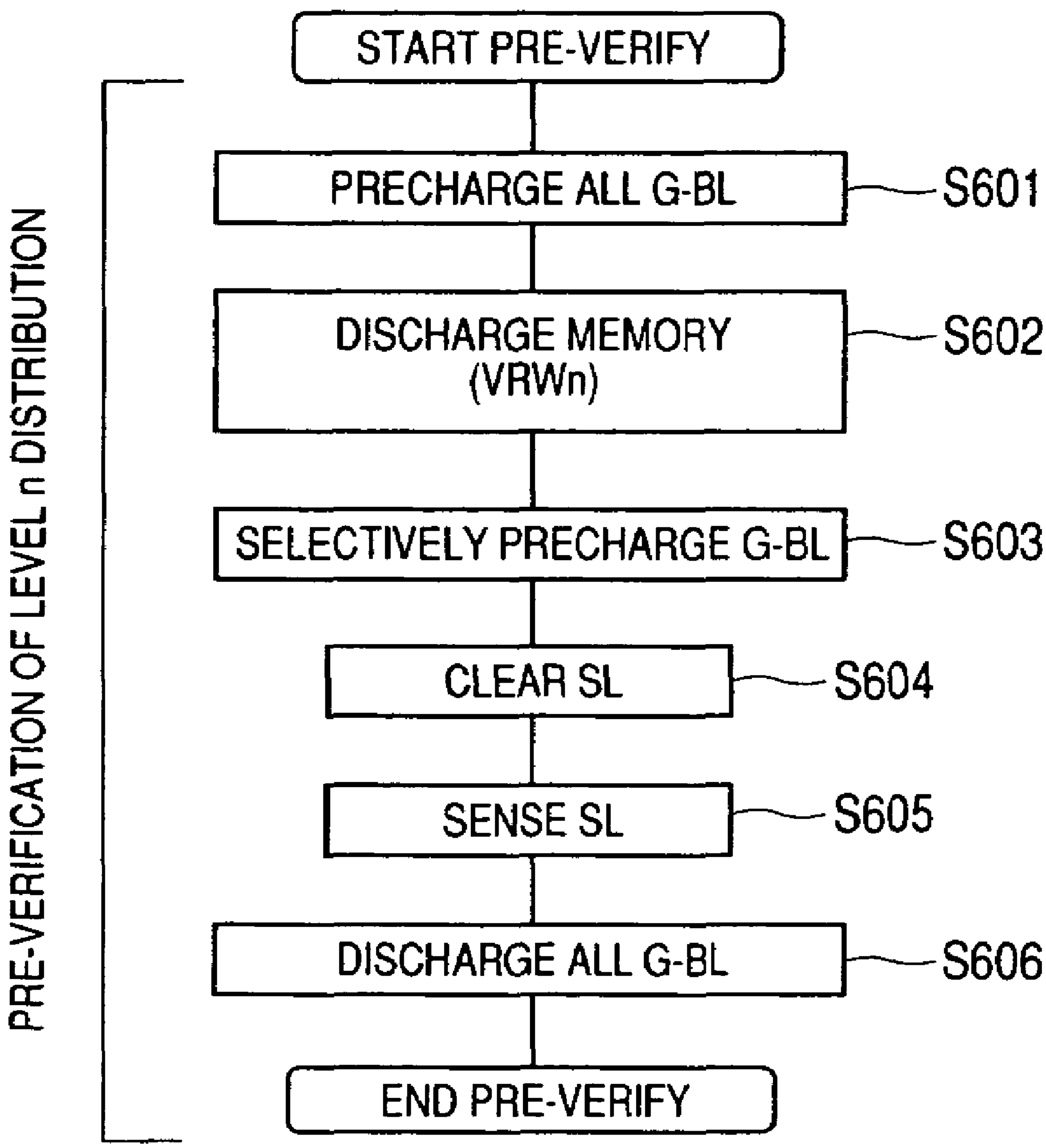
FIG. 16 is a flowchart showing details of the pre-verify.

To go into further detail, as shown in FIG. 16, in preverifying level n distributions including "00" distribution and "10" distribution to be described afterwards, after precharting all the global bit lines, a read voltage VRWn corresponding to the level n distribution is applied to word lines to discharge memory cells (steps S601 and S602). And, after selectively pre-charging global bit lines, the nodes of the sense latch circuit are cleared, and data on the global bit lines are sensed by the sense latch circuit (steps S603 through S605). After that, all the global bit lines are discharged (step S606).

Pre-verification of "10" distribution, as the pre-verification of "00" distribution described above, is also accomplished by applying a lower limit determination voltage VWV1 corresponding to the "10" distribution to word lines (steps S508 and S509).

(3) Disturb determination of "00" distribution is accomplished by reading of the upper limit of "00" distribution (VWE2), selective discharging of global bit lines, sensing by the sense latch circuit, and inversion of data in this sequence (steps S513 through S516).

(4) Erratic determination of "10" distribution is accomplished by reading of the upper limit of "10" distribution (VWE1), selective discharging of global bit lines, sensing by the sense latch, and inversion of data in this sequence (steps S518 through S521).

(5) Disturb determination of "11" distribution on the selected page side is accomplished by reading of the upper limit of "11" distribution (VWE0), selective discharging of global bit lines, sensing by the sense latch circuit, and inversion of data in this sequence (steps S523 through S526).

Figure 17:
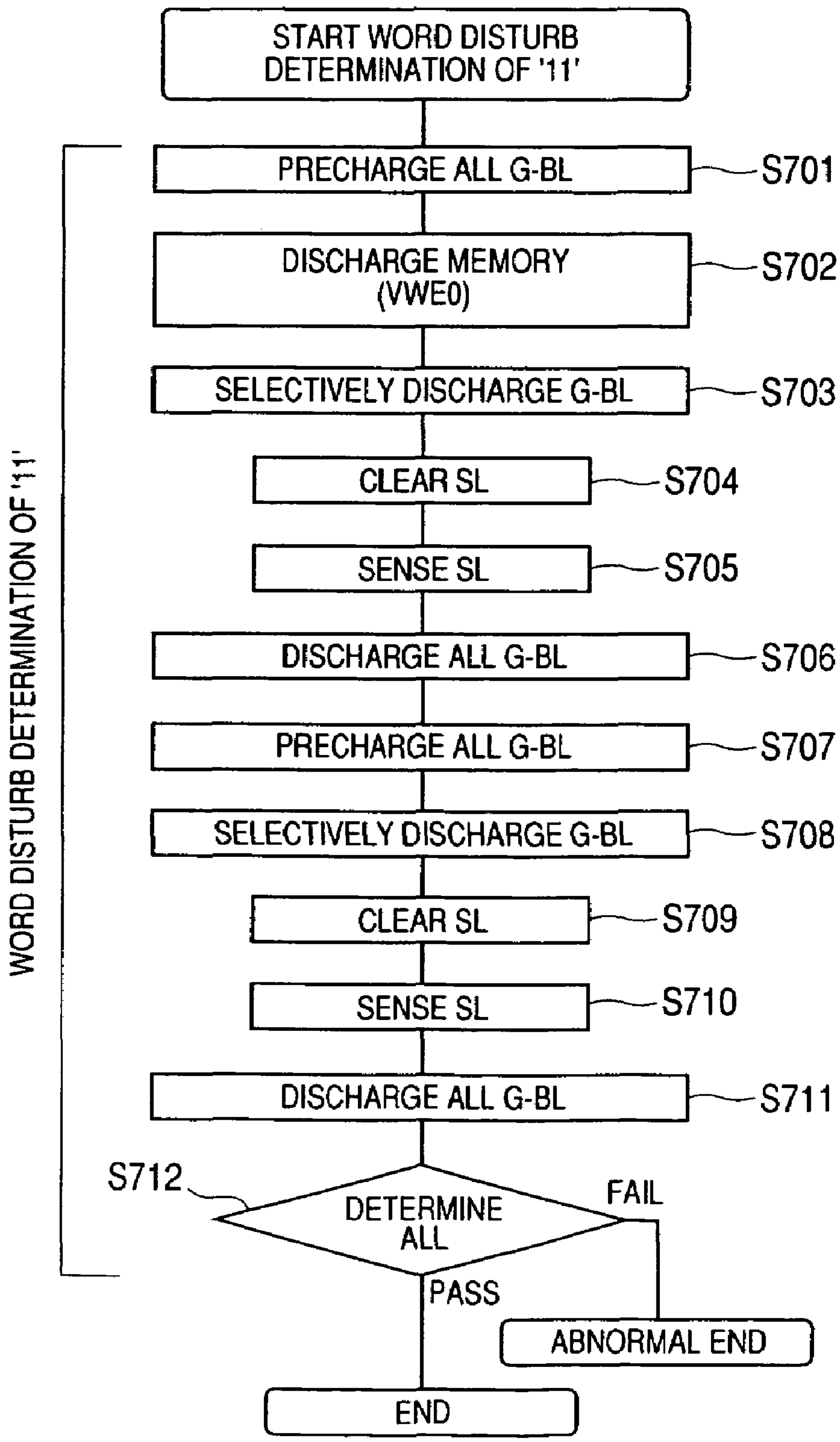
FIG. 17 is a flow chart showing details of disturb determination.

To go into further detail, as shown in FIG. 17, disturb determination of "11" distribution on the selected page side is accomplished by precharging all the global bit lines and applying an upper limit determination voltage VWE0 corresponding to the "11" distribution to word lines to discharge memory cells (steps S701 and S702). And, after selectively discharging global bit lines, the nodes of the sense latch circuit are cleared and, after having the sense latch circuit sense and hold data on global bit lines, all the global bit lines are discharged (steps S703 through S706). After that, all the global bit lines are precharged and, after selectively discharging global bit lines, the nodes of the sense latch circuit are cleared, and the sense latch circuit is caused to sense and hold data on global bit lines (steps S707 through S710). And, after discharging all the global bit lines, total determination is performed (steps S711 and S712).

(6) Word disturb determination (simplified upper limit determination) of "11" distribution on the unselected page side is accomplished by reading of "10" distribution (VRW1), sensing by the sense latch circuit, reading of the upper limit of "11" distribution (VWE0), selective discharging of global bit lines, sensing by the sense latch circuit, and inversion of data in this sequence (steps S527 through S532).

Figure 18:
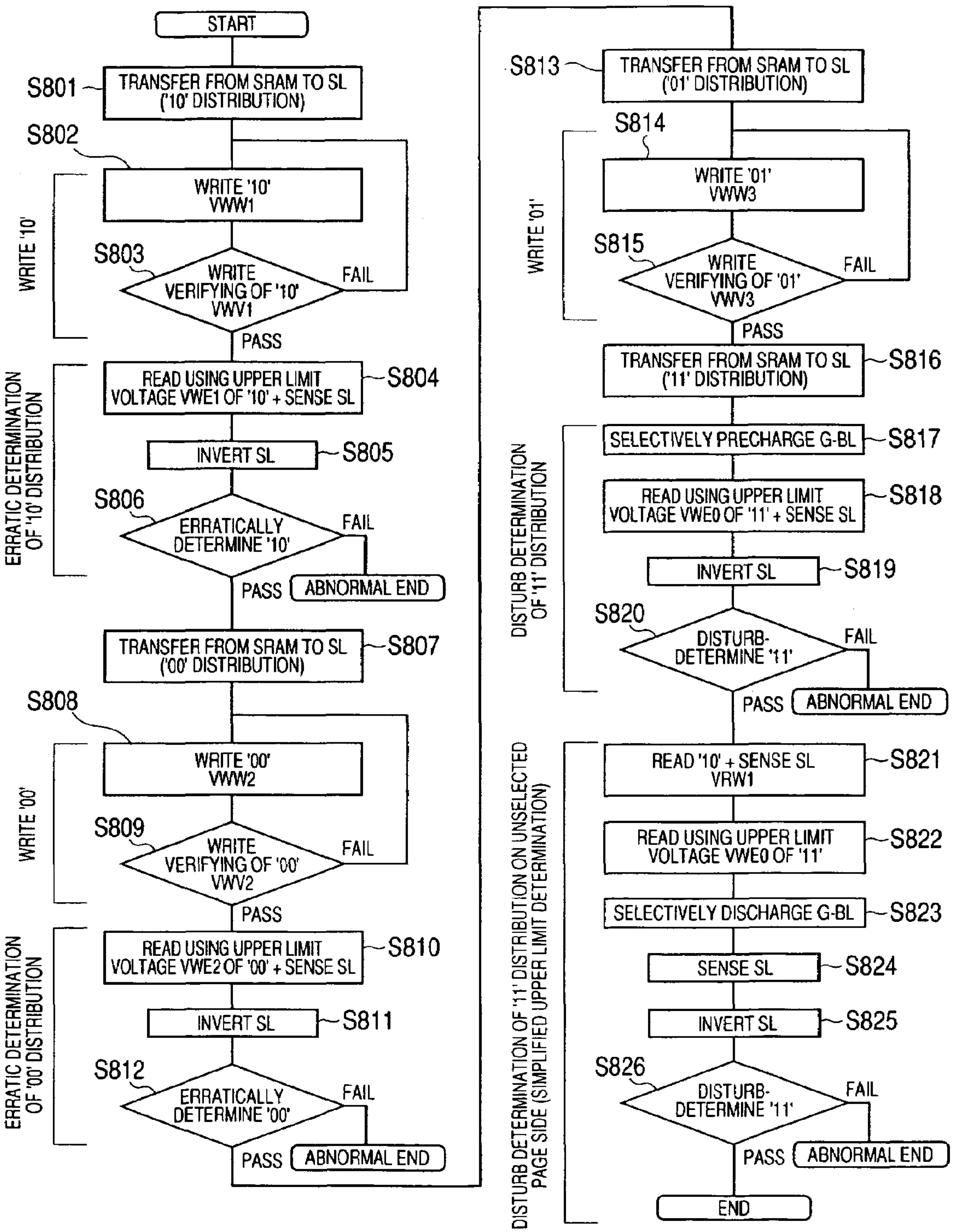
FIG. 18 is a flow chart showing a write mode with pre-verify from the lower voltage side.

As shown in FIG. 18, in the write mode with pre-verify from the lower voltage side, after data are transferred from the SRAMs to the sense latch circuit ("10" distribution), writing of "10" distribution and erratic determination of "10" distribution are performed; after data are transferred from the SRAMs to the sense latch circuit ("00" distribution), writing of "00" distribution and erratic determination of "00" distribution are performed; after data are transferred from the SRAMs to the sense latch circuit ("01" distribution), writing of "01" distribution is performed; after data are transferred from the SRAMs to the sense latch circuit ("11" distribution), disturb determination of "11" distribution and disturb determination (simplified upper limit determination) of "11" distribution on the unselected page side are performed in this sequence.

In this write mode from the lower voltage side, since various data transfers from the SRAMs to the sense latch circuit ("10" distribution (step S801), "00" distribution (step S807), "01" distribution (step S813) and "11" distribution (step S816)); the writing of "10" distribution (steps S802 and S803), "00" distribution (steps S808 and S809) and "01" distribution (steps S814 and S815); erratic determination of "10" distribution (steps S804 through S806) and "00" distribution (steps S810 through S812); disturb determination of "11" distribution (steps S817 through S820); and disturb determination (simplified upper limit determination) of "11" distribution on the unselected page side (steps S821 through S826) are performed in the same way in the write mode described above, their detailed description is dispensed with here.

This write mode from the lower voltage side is characterized in particular by (1) writing from the lower voltage side of the threshold voltage distribution of the multi-value memory, and (2) consecutive "write processing" and "upper limit determination processing" for each threshold voltage distribution of memory cells. For this reason, after the completion of the write processing of "10" distribution and "00" distribution, the threshold voltage of every memory cell is lower than the upper limit determination voltages of "10" distribution and "00" distribution. Accordingly, in the processing of upper limit determination for "10" distribution and "00" distribution, no other threshold voltage distributions is masked, making the transfer of write data unnecessary.

Figure 19:
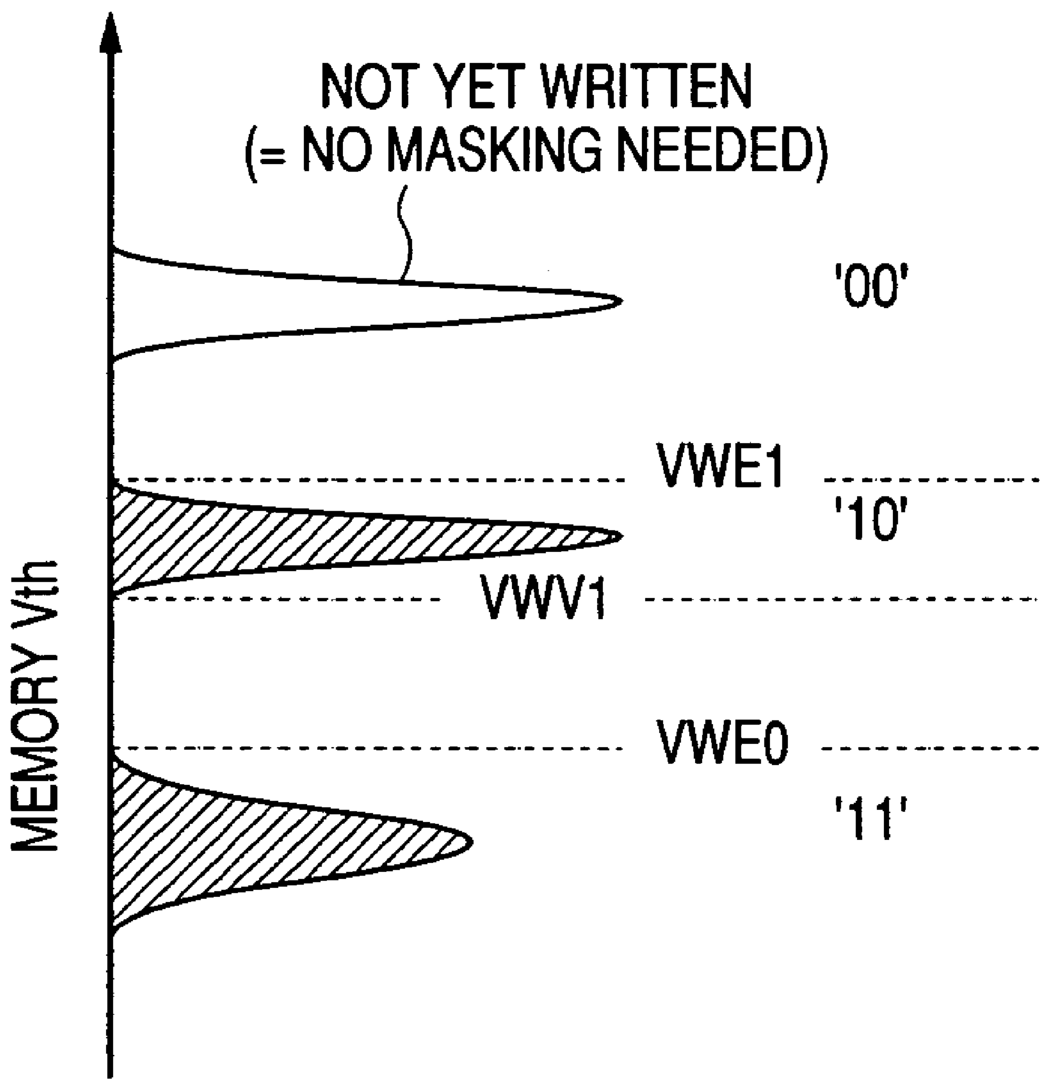
FIG. 19 illustrates the threshold voltage distribution in memory cells immediately after the end of write processing.

To consider a case of write processing for "10" distribution for instance as shown in FIG. 19, the threshold voltage distribution in every memory cell immediately after the completion of write processing of this "10" distribution is lower than the upper limit determination voltage VWE1 of the "10" distribution and the threshold voltage of "00" distribution is not yet written, no masking is needed.

Figure 20:
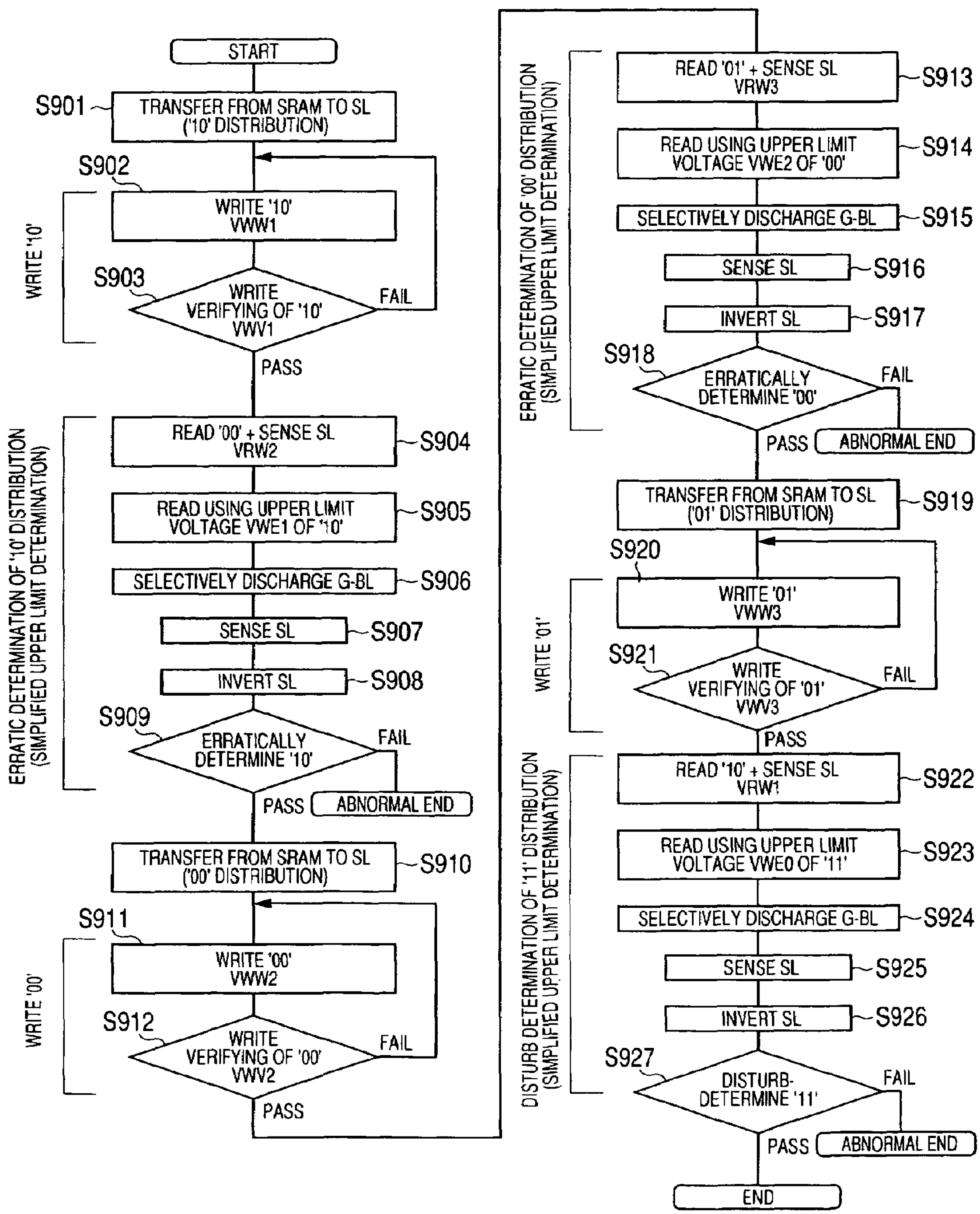
FIG. 20 is a flow chart showing a write mode with pre-verify using simplified upper limit determination.

As shown in FIG. 20, in the write mode with pre-verify using simplified upper limit determination, after data are transferred from the SRAMs to the sense latch circuit ("10" distribution), writing of "10" distribution and erratic determination (simplified upper limit determination) of "10" distribution are performed; after data are transferred from the SRAMs to the sense latch circuit ("00" distribution) writing of "00" distribution and erratic determination (simplified upper limit determination) of "00" distribution are performed; and after data are transferred from the SRAMs to the sense latch circuit ("01" distribution), writing of "01" distribution and disturb determination (simplified upper limit determination) of "11" distribution are performed. To add, in disturb determination (simplified upper limit determination) of "11" distribution, word disturb determination is performed on the unselected sector side.

In this write mode with pre-verify using simplified upper limit determination, since various data transfers from the SRAMs to the sense latch circuit ("10" distribution (step S901), "00" distribution (step S910) and "01" distribution (step S919)); the writing of "10" distribution (steps S902 and S903), "00" distribution (steps S911 and S912) and "01" distribution (steps S920 and S921); erratic determination (simplified upper limit determination) of "10" distribution (steps S904 through S909) and "00" distribution (steps S913 through S918); and disturb determination (simplified upper limit determination) of "11" distribution (steps S922 through S927) are performed in the same way as in the write mode described above, their detailed description is dispensed with here.

In this write mode with pre-verify using simplified upper limit determination, memory cells to which upper limit determination is to be selected on the basis of data stored in the memory cells. As write data on the SRAMs are not used for this purpose, no write data transfer is needed at the time of processing upper limit determination of "11" distribution, "10" distribution or "00" distribution (in particular "11" distribution is referred to as erase distribution).

Figure 21:
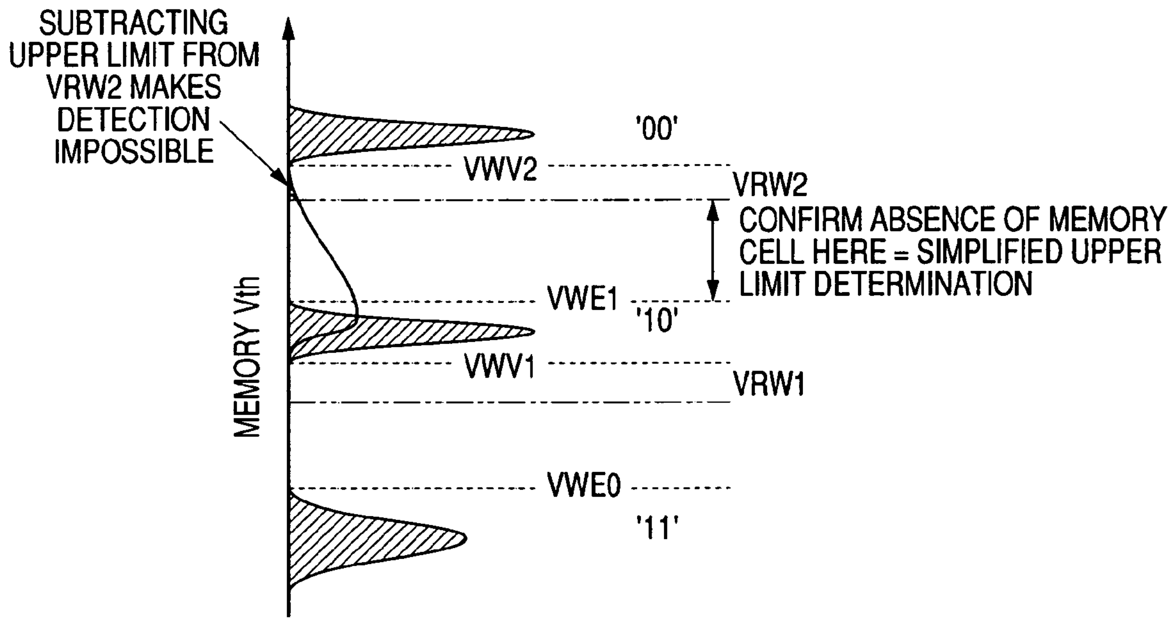
FIG. 21 illustrates simplified upper limit determination and the threshold voltage distribution in memory cells.

To consider, for instance, simplified upper limit determination of "10" distribution as shown in FIG. 21, simplified upper limit determination of this "10" distribution confirms the existence of no memory cell having a threshold voltage between the 'read voltage VRW2 of "00" distribution (threshold voltage distribution of a level higher voltage than "10" distribution)' and the 'upper limit determination voltage VWE1 of "10" distribution'. Generally, processing of simplified upper limit determination of a level n distribution confirms the existence of no memory cell having a threshold voltage between the 'read voltage of the level n+1 distribution' and the 'upper limit determination voltage of the level n distribution'.

Further in the write mode with pre-verify using simplified upper limit determination, there is no need consecutively perform "write processing" and "upper limit determination processing" for every threshold voltage of memory cells. Further, upper limit determination for erase distribution is performed, for the purpose of write disturb determination, after the completion of write processing for every distribution.

Therefore in the write mode with pre-verify using simplified upper limit determination, since no write data transfer is needed, while the writing speed can be raised, there is an undesirable side effect that, even if the threshold voltage of a memory cell which should otherwise be in a level n distribution is above the read voltage of the level n+1 distribution, this cannot be detected. Moreover, combined use of this write mode with pre-verify and the above-described write mode with pre-verify from the lower voltage side would not contribute to further reducing the number of write data transfers.

As stated above, use of the simplified upper limit determination formula in the write mode with pre-verify makes possible realization of additional writing in the 1×sense latch circuit+2×SRAM configuration. This additional writing means writing again into a memory cell on a word line into which writing has been already done without performing erasure. Processing of upper limit determination requires one-to-one correspondence between write data on a SRAM and data on a memory cell into which writing has been already done. However, in additional writing, since there is no one-to-one correspondence between write data on a SRAM and data on a memory cell into which writing has been already done, upper limit determination processing on the basis of write data on a SRAM will not pass.

However, in simplified upper limit determination processing, since no write data are used but the memory cell to which upper limit determination is to be applied is selected on the basis of data stored in a memory cell, upper limit determination can be processed even if there is no one-to-one correspondence between write data on a SRAM and data on a memory cell into which writing has been already done as in the case of additional writing.

Figure 22:
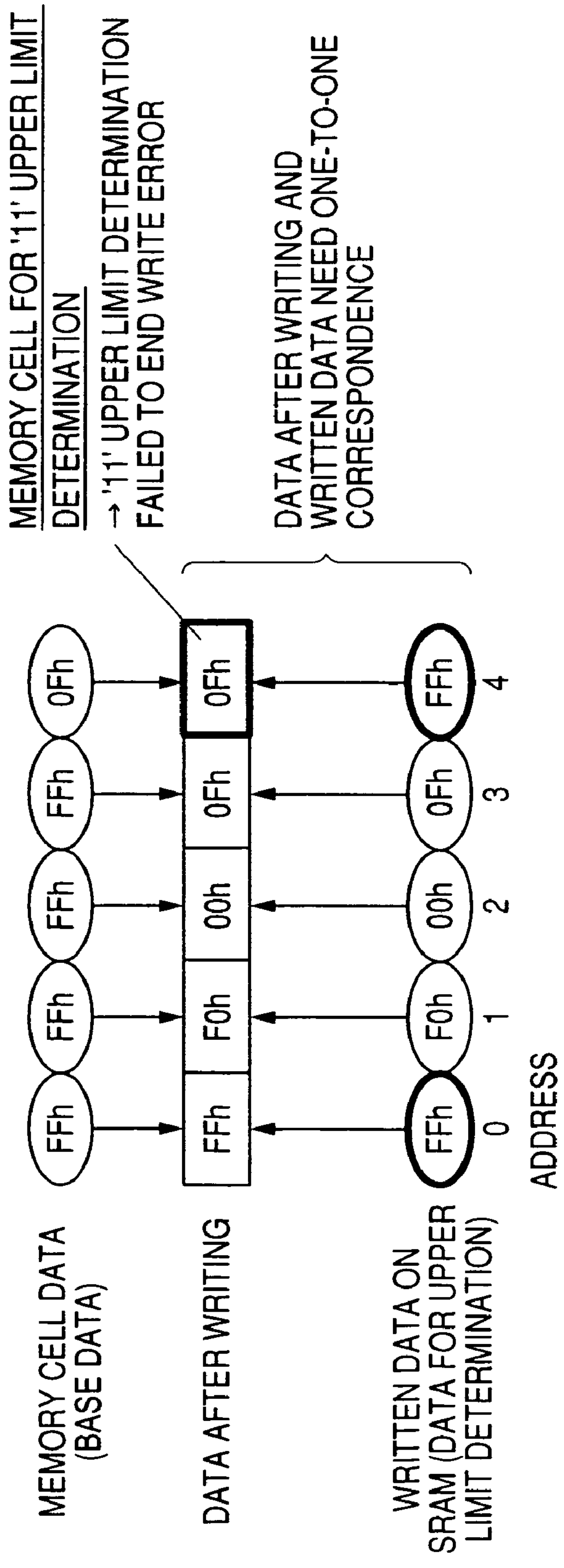
FIGS. 22(*a*) and 22(*b*) illustrate upper limit determination at the time of additional write.

To consider a case in which, for instance, upper limit determination of "11" distribution is processed on the basis of write data on a SRAM as shown in FIG. 22, the write data are FF, F0, 00, 0F and FF at addresses 0 through 4, and the expected values of memory cells are FF, F0, 00, 0F and 0F. The objects of upper limit determination are addresses 0 and 4 where the SRAM is used while in simplified upper limit determination, the object is address 0, and in this case address 4 fails in upper limit determination and results in a write error.

Figure 23:
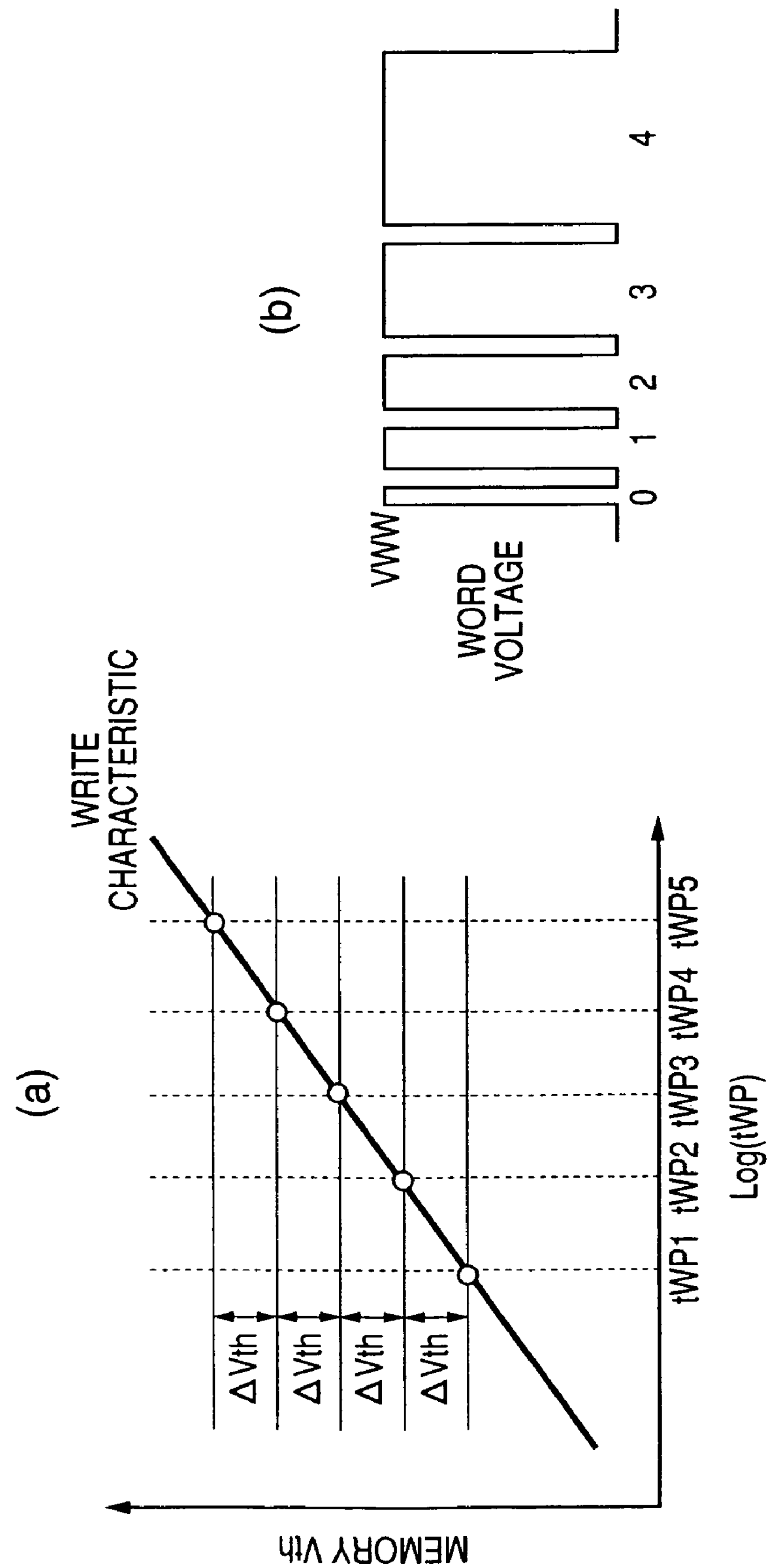
FIGS. 23(*a*) and 23(*b*) illustrate write characteristics and a power pulse formula.

The write characteristics of the flash memory when any write voltage (VWW) is applied in the write mode with pre-verify described above, are known to be such that, for instance as shown in FIG. 23(*a*), the threshold voltage (Vth) of the memory cell is linear relative to the logarithm (Log) of the cumulative duration of write biasing (write pulse length tWP). Accordingly, there is a problem that, where the write pulse length is fixed, the increment ΔVth of the threshold voltage of the memory cell per write pulse application gradually decreases and the number of times of write verification increases. Then, in order to optimize the number of times of write verification with ΔVth being kept constant, a "power pulse formula (bias=constant with the pulse length increasing at a power multiplying ratio)" by which the duration of write biasing is extended to the power of the cumulative biasing duration for each write pulse, as shown in FIG. 23(*b*), is used for instance. Incidentally, the write voltage (VWW) is constant for each write pulse.

Although this power pulse formula makes possible optimization of the number of times of write verification, as the pulse length (tWP) extends for each write pulse, there is a problem that the write biasing duration (ΣtWP) increases exponentially. Therefore, more preferably, the incremental step pulse programming (ISPP) formula to be described below (bias increasing by only ΔVWW for each pulse, with the pulse length remaining constant) should be used.

Figure 24:
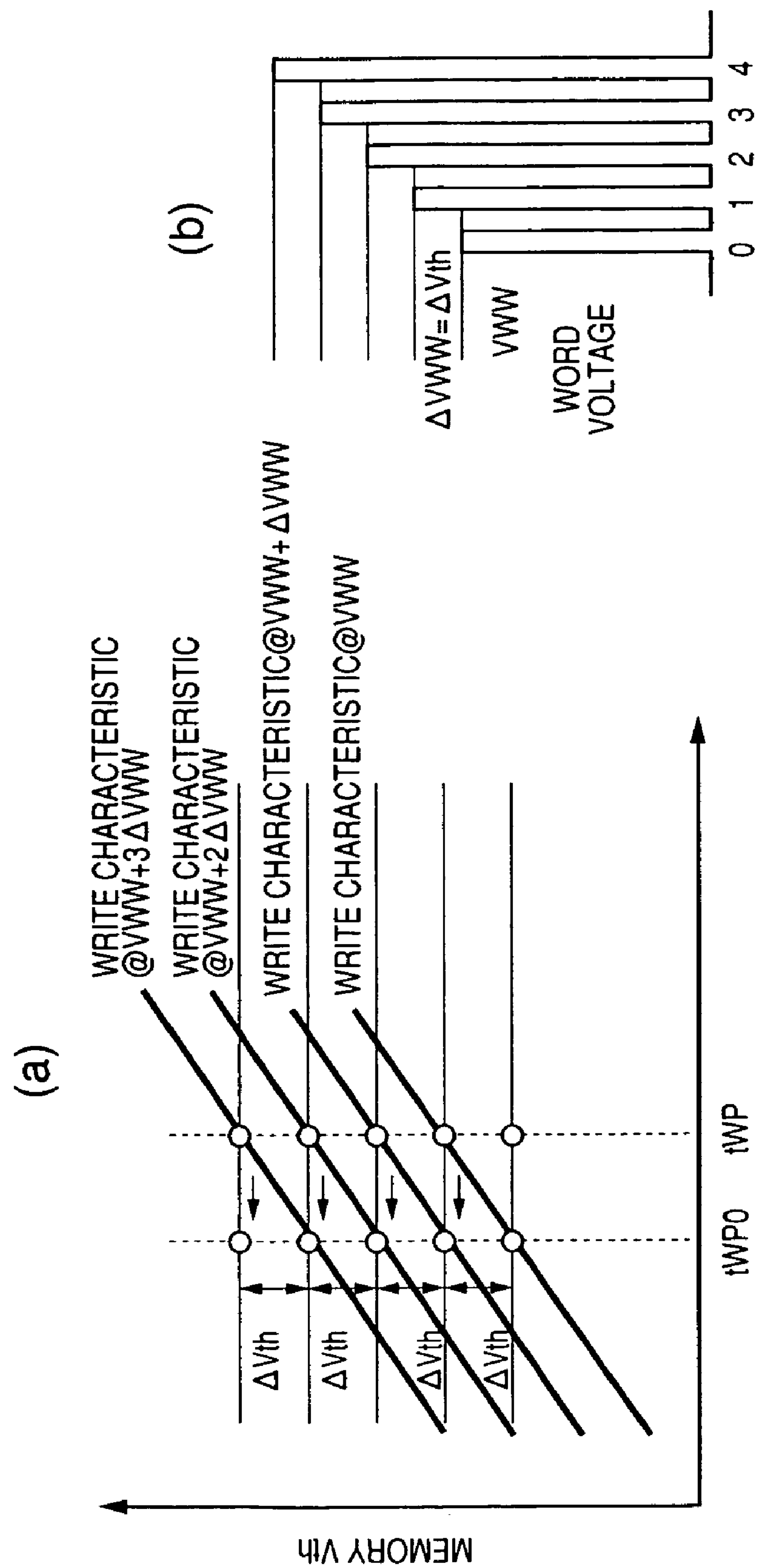
FIGS. 24(*a*) and 24(*b*) illustrate an ISPP formula.

By this ISPP formula, unlike the power pulse formula by which the write voltage (VWW) is constant for every write pulse, the pulse length (tWP) is constant for each write pulse. By the ISPP formula, as shown in FIGS. 24(*a*) and 24(*b*) for instance, the write bias is increased by ΔVth for each pulse (VWWn+1=VWWn+ΔVth) and the write pulse length is kept constant. As this causes the threshold voltage of the memory cell by ΔVth for each pulse, this formula makes possible optimization of the number of times of write verification as does the power pulse formula.

Incidentally, this ISPP formula involves a problem that the greater the number of times of write pulse application, the higher the write voltage (VWW). However, as a flash memory of 1 Gbit, for instance, uses a channel hot electron injection formula which allows VWW to be reduced to a lower voltage than FN tunneling does, this side effect poses no operational problem. Thus, the channel hot electron injection formula can keep the write word voltage lower than FN tunneling can.

Figure 25:
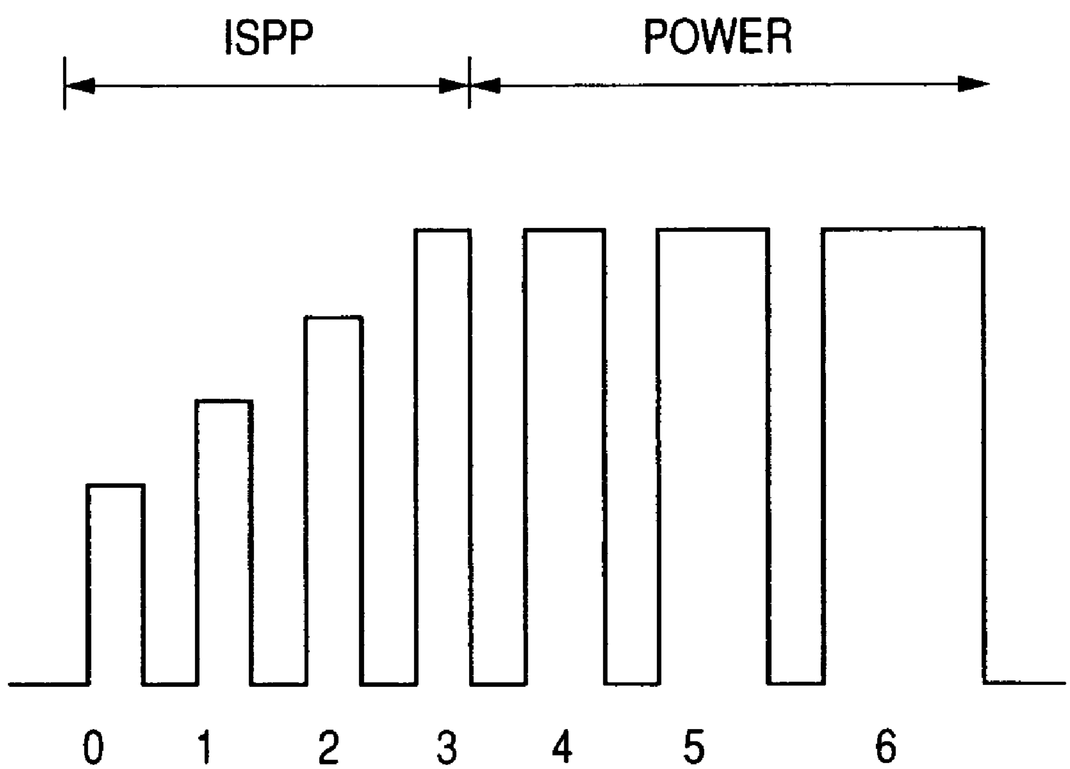
FIG. 25 illustrates a combination of the power pulse formula and the ISPP formula.

It is also possible to combine the power pulse formula referred to above and the ISPP formula to apply write bias. This formula, as shown in FIG. 25 for instance, by increasing the write voltage for each one of write pulses 0 through 3 and extending the pulse length by power multiplication for each of write pulses 4 through 6, the problem of the extending write biasing duration and that of the rising write voltage can be optimally solved.

One example of erase operation in the flash memory in this mode of implementation will be described with reference to FIG. 26 through FIG. 31. This erase operation can be accomplished for example in, though not limited to, a two-page erase mode shown in FIG. 26 through FIG. 28 or a multi-page erase mode shown in FIG. 29 through FIG. 31.

Figure 28:
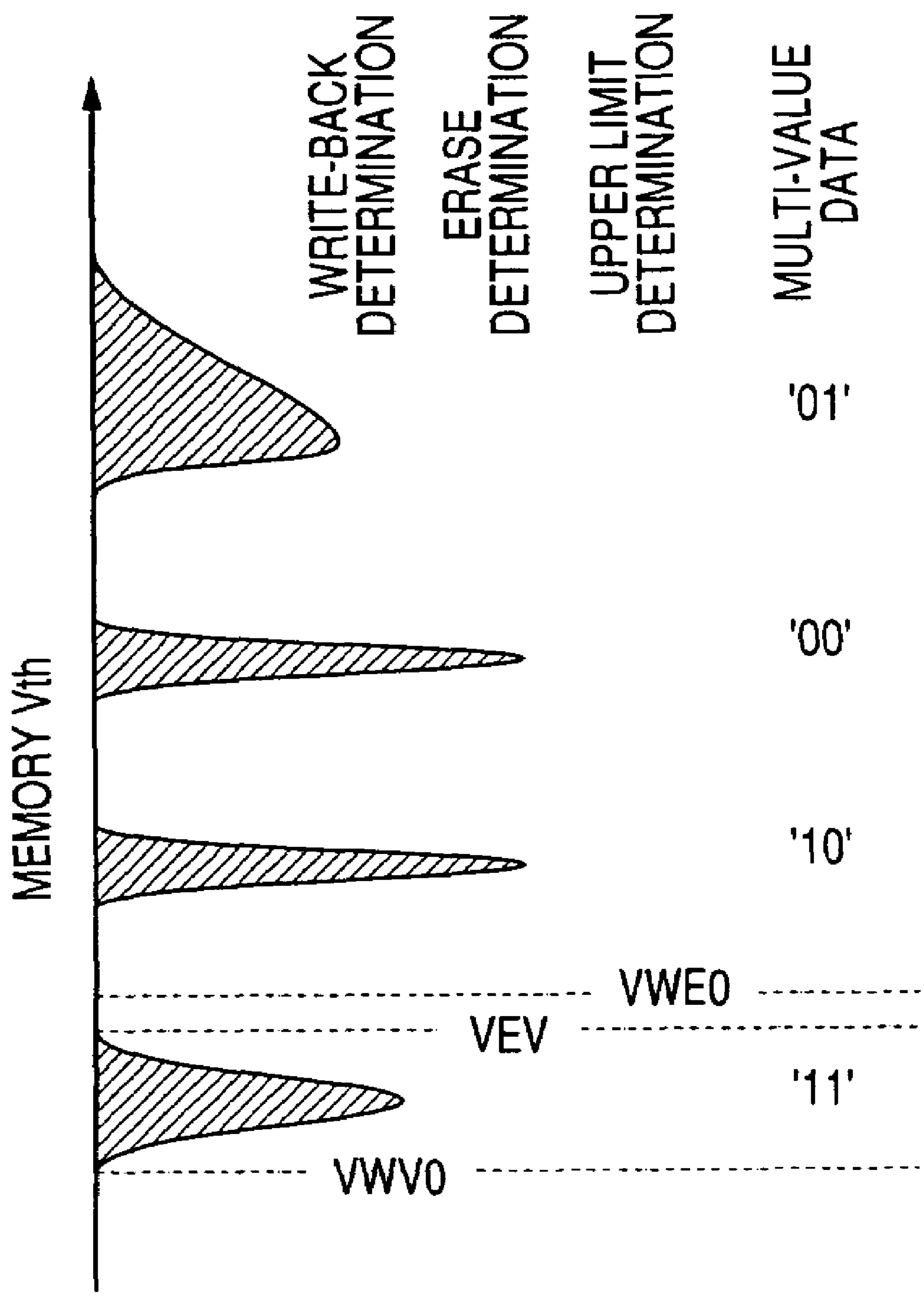
FIG. 28 illustrates the relationship between the threshold voltage distribution in memory cells and the erase operation voltage.

In this erase mode, the relationships among the threshold voltage distribution (erase voltage), the upper limit determination, the erase determination voltage and the write-back determination voltage of memory cells are as shown in FIG. 28. For the "11" distribution of multi-value data, the upper limit determination voltage is set to VWEO, the erase determination voltage to VEV and the write-back determination voltage to VWV0.

This erase mode, as it uses no SRAM, can be applied to the 1×sense latch circuit+2×data latch circuit configuration for instance. The erase mode consists of "erase processing" and "write-back processing". In the erase processing, an erase bias is applied to the page to be erased, followed by erase verification, and the sequence from erase biasing to erase verification is repeated until the page to be verified passes erase verification. The write-back processing is consecutively applied to every page selected for erasure as write-back verification automatically selects for writing-back the memory cells which have failed to pass write-back verification without clearing the failed memory cells of the information stored therein.

Out of the two versions of the erase mode, the two-page erase mode is a formula of collectively erasing a plurality of pages selected as desired. This mode makes it possible, in particular, (1) to take into account fluctuations in erase characteristics and to apply erase verification only to any one page out of the pages to be erased, thereby to reduce the frequency of erase verification to the necessary minimum, and (2) to prevent faults in erase upper limit as consecutive page-by-page write-back processing dispenses setting of the memory cell to be written-back for every round of write-back verification. Further details will be described below with reference to FIG. 26 and FIG. 27.

Figure 26:
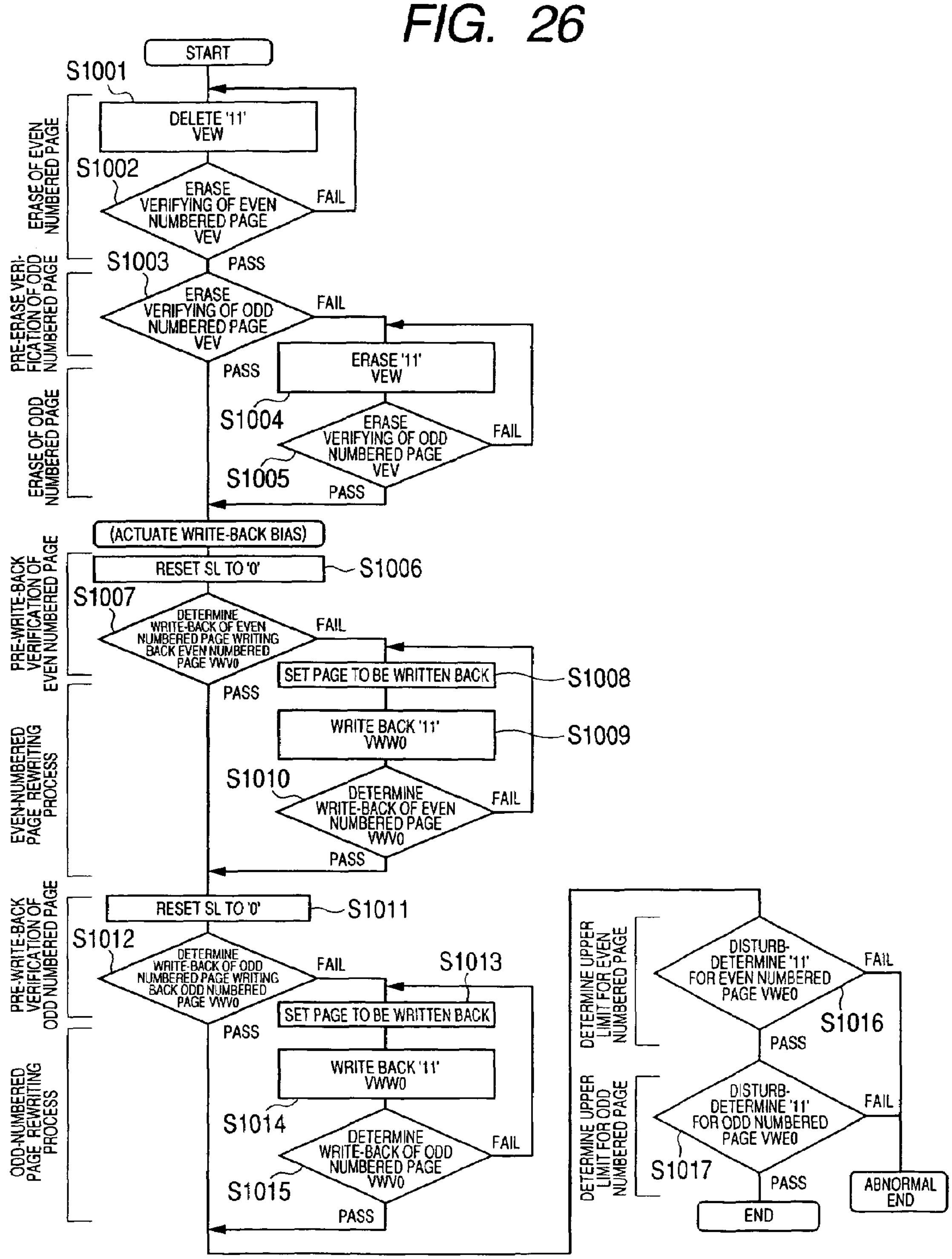
FIG. 26 is a flow chart of a two-page erase mode.

As shown in FIG. 26, in the two-page erase mode, even numbered page erasure, odd numbered page pre-erasure verification, odd numbered page erasure, even numbered page pre-write-back verification, even numbered page write-back processing, odd numbered page pre-write-back verification, odd numbered page write-back processing, even numbered page upper limit determination processing and odd numbered page upper limit determination processing are performed in this sequence.

(1) In even numbered page erasure, an erase voltage (VEW) is collectively applied to the even numbered page out of the pages to be erased, followed by erase verification (steps S1001 and S1002) To optimize the frequency of erase verification in this processing, erase verification is applied only to any one desired page of the even numbered page or odd numbered page, which is to be referred to below. In this erase verification, it is determined whether or not the applied voltage is lower than the erase determination voltage VEV; if the page to be verified passes erase verification, the process will advance to the next step or, if it fails, the processing from erase voltage application to erase verification will be repeated until it passes the verification. Incidentally, when a prescribed length of time is surpassed, an abnormal flag is set and a shift to the next step is done.

Figure 27:
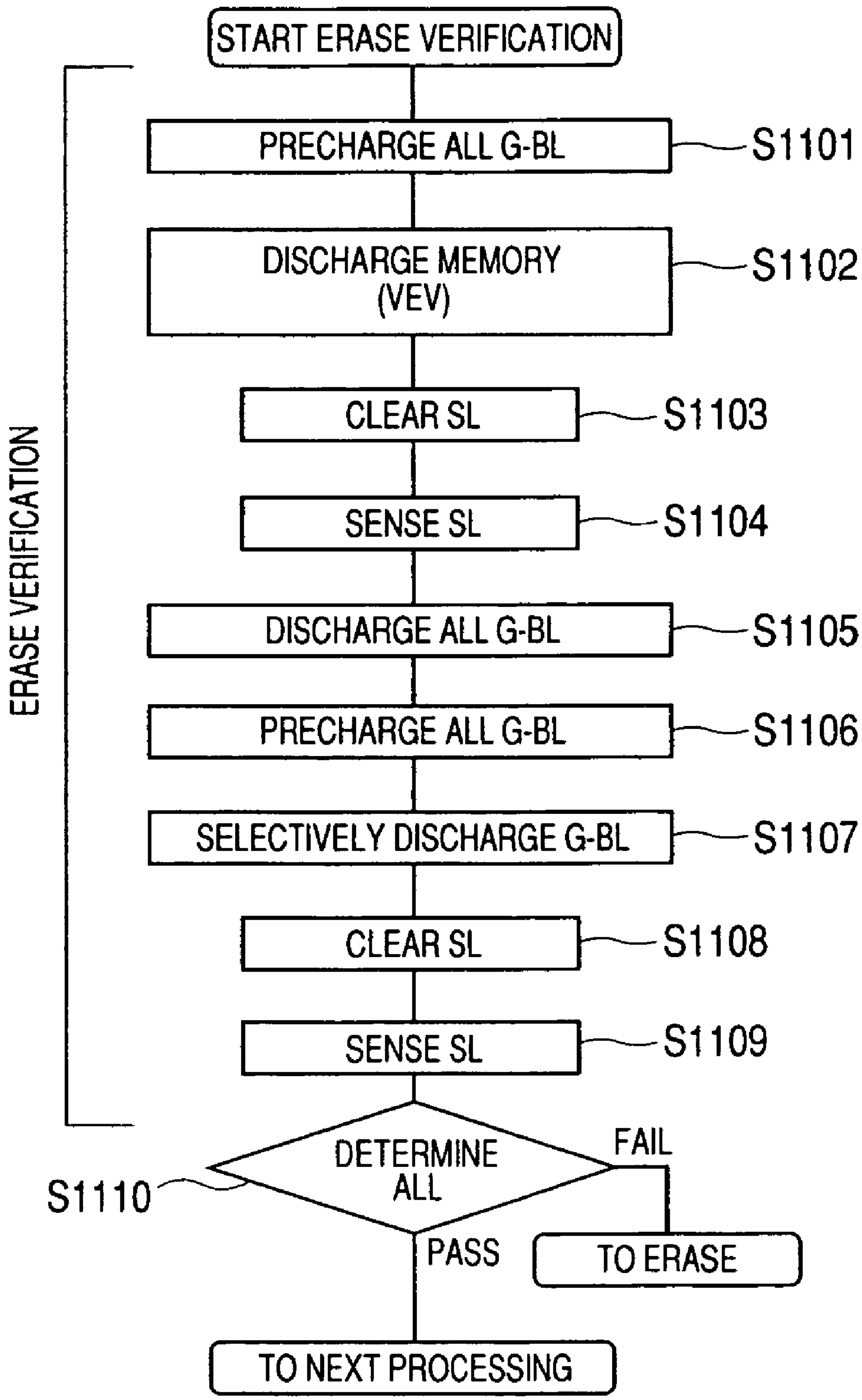
FIG. 27 is a flow chart showing details of erase verification.

To go into further detail, as shown in FIG. 27, in the erase verification of an even numbered page or an odd numbered page, which are to be referred to below, after all the global bit lines are precharged, an erase determination voltage VEV corresponding to "11" distribution is applied to word lines to discharge memory cells (steps S1101 and S1102). And the nodes of the sense latch circuit are cleared and, after having the sense latch circuit sense and hold data on global bit lines, all the global bit lines are discharged (steps S1103 through S1105). Then, all the global bit lines are precharged; after selective discharging of global bit lines, the node of the sense latch circuit are cleared, and the sense latch circuit is caused to sense and hold data on global bit lines (steps S1106 through S1109), followed by total determination (step S1110).

(2) In odd numbered page pre-erase verification, the odd numbered page is erase-verified (step S1003). At this step, it is determined whether or not the applied voltage is lower than the erase determination voltage VEV; if the page to be verified passes erase verification, the process will advance to the write-back processing or, if it fails, to odd numbered page erase processing.

(3) In odd numbered page erasure, as in the even numbered page erasure described above, an erase voltage (VEW) is applied to the odd numbered page among the pages to be erased, followed by erase verification (erase determination voltage VEV) (steps S1004 and S1005). If the page to be verified passes this erase verification, the process will advance to the write-back processing or, if it fails, the processing from erase voltage application to erase verification will be repeated until it passes the verification; when a prescribed length of time is surpassed, an abnormal flag is set and a shift to the next step is done. Incidentally, this erase verification of the odd numbered page can be dispensed with if the even numbered page is subjected to erase verification.

(4) In even numbered page pre-write-back verification, the sense latch circuit is reset to "0" for the even numbered page, followed by write-back determination (steps S1006 and S1007). In this write-back determination, it is determined whether or not the applied voltage is higher than a write-back determination voltage VWV0; if the page to be pre-written back passes write-back verification, the process will advance to odd numbered page pre-write-back verification processing or, if it fails, to even numbered page write-back processing.

(5) In even numbered page write-back processing, after setting the even numbered page to be written back, a write-back voltage (VWW0) is applied to the page to be written back, followed by write-back determination (steps S1008 through S1010). In this write-back determination, it is determined whether or not the applied voltage is higher than the write-back determination voltage VWV0; if the page to be written back passes write-back verification, the process will advance to odd numbered page pre-write-back verification processing or, if it fails, the sequence from setting of the page to be written back to write-back and write-back determination will be written back. Incidentally, when a prescribed length of time is surpassed, write-up processing will be performed to an abnormal end.

(6) In odd numbered page pre-write-back verification, as in the even numbered page pre-write-back verification described above, the sense latch circuit is reset to "0" for the odd numbered page, followed by write-back determination (write-back determination voltage VWV0) (steps S1011 and S1012). If the page passes this write-back determination, the process will advance to even numbered page upper limit determination processing or, if it fails, will shift to odd numbered page write-back processing.

(7) In odd numbered page write-back processing, as in the even numbered page write-back processing described above, after setting the odd numbered page to be written back, a write-back voltage (VWW0) is applied to the page to be written back, followed by write-back determination (write-back determination voltage VWV0) (steps S1013 through S1015). If the page passes this write-back determination, the process will advance to even numbered page upper limit determination processing or, if it fails, the sequence will be repeated until it passes the determination, and when a prescribed length of time is surpassed, write-up processing will be performed to an abnormal end.

(8) In even numbered page upper limit determination processing, the even numbered page is subjected to word disturb determination (step S1016). In this word disturb determination, it is determined whether or not the applied voltage is lower than the upper limit determination voltage VWE0; if the page passes this determination, the process will advance to the odd numbered page upper limit determination processing or, if it fails, will hold threshold voltage distribution to an abnormal end. Incidentally, this write-back upper limit determination processing is consecutively applied to two pages, including the even numbered page and the odd numbered page to be described afterwards.

(9) In odd numbered page upper limit determination processing, as in the even numbered page upper limit determination processing described above, the odd numbered page is subjected to word disturb determination (upper limit determination voltage VWE0) (step S1017). If the page passes this word disturb determination, the processing will end or, if it fails, will hold threshold voltage distribution to an abnormal end.

Next in a multi-page erase mode, as the writing principle in the above-described AG-AND type memory array configuration uses a hot electron injection write formula, if any excessively erased memory cell is included in a write-back selection string, no sufficient write current can be obtained, making write-back processing impossible. This excessively erased memory cell is referred to as a depleted memory cell (whose threshold voltage is 0 V or below), and if it is connected to the same bit line as the selected memory cell, a write current will flow to it even though it is not selected.

Figure 29:
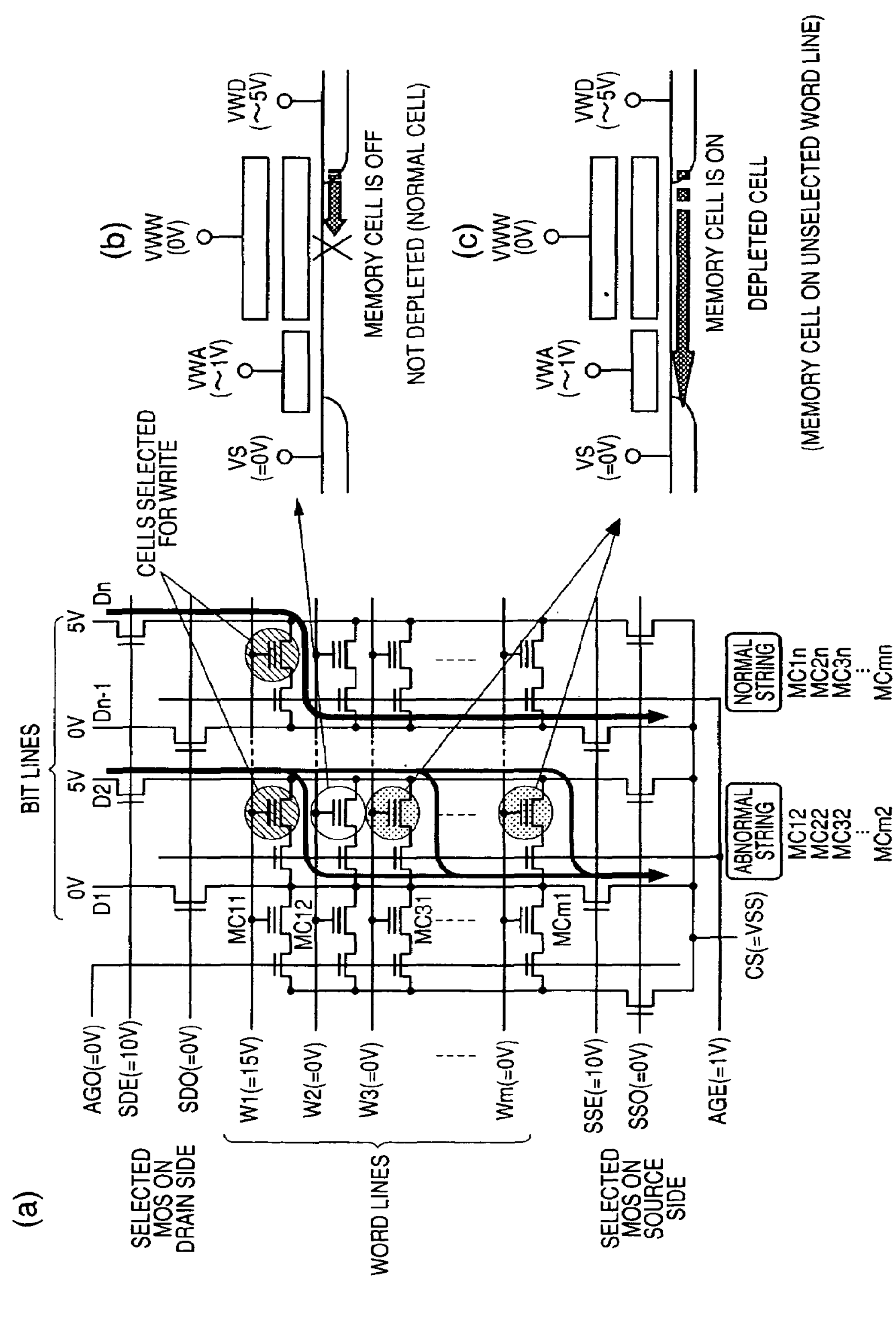
FIGS. 29(*a*) through 29(*c*) illustrate write-back in the presence of any deplete bit.

For instance as shown in FIG. 29, there will arise a problem that, in a block consisting of memory cells MC11 through MCmn, a string consisting of a memory row of memory cells MC12 through MCm2 becomes abnormal. As shown in FIG. 29(*a*), in write-back processing, where memory cells MC12, . . . , MC1*n* of an even numbered memory row out of the memory cells leading to a word line W1 are to be selected for writing, 15 V is applied to the word line W1, and 5 V is applied to each of bit lines D2, . . . , Dn. To other word lines W2 through Wm and other bit lines Di, . . . , Dn−1 is applied 0 V. At the same time, 10 V is applied to the drain-side control signal line SDE and the source-side control signal line SSE of even numbered memory rows, 0 V is applied to the drain-side control signal line SDO and the source-side control signal line SSO of even numbered memory rows; 1 V is applied to the gate control signal line AGE of even numbered memory rows, and 0 V is applied to the gate control signal line AGO of odd numbered memory rows.

Under such voltage conditions of write-back processing, although the memory cell MC22 for instance is a normal memory cell not depleted (FIG. 29(*b*)) out of the memory cell MC12 through MCm2 constituting the abnormal string, if the memory cells MC32, MCm2 are depleted memory cells (FIG. 29(*c*)), these depleted memory cells MC32, . . . , MCm2 will be turned on, and the write current destined for the memory cell MC12 will be dispersed and flow also to the depleted memory cells MC32, . . . , MCm2 other than the memory cell MC12. Therefore, no sufficient write current for the memory cell MC12, which is selected for write, can be secured, making it impossible to accomplish write-back processing.

Then, in order to erase any number, two or more, of pages at the same time, it is necessary (1) to erase any one word line in a plurality of blocks, and (2) apply scrambling so that page addresses be consecutive between blocks. As these measures will serve to enlarge the unit of erasure, the erase rate can be thereby enhanced. Further, erase verification is concentrated on any desired one page as in the two-page erase mode described above. To add, these measures can obviously provide similar benefits when considered on a bank-by-bank basis, each bank consisting of a prescribed number of blocks.

Figure 30:
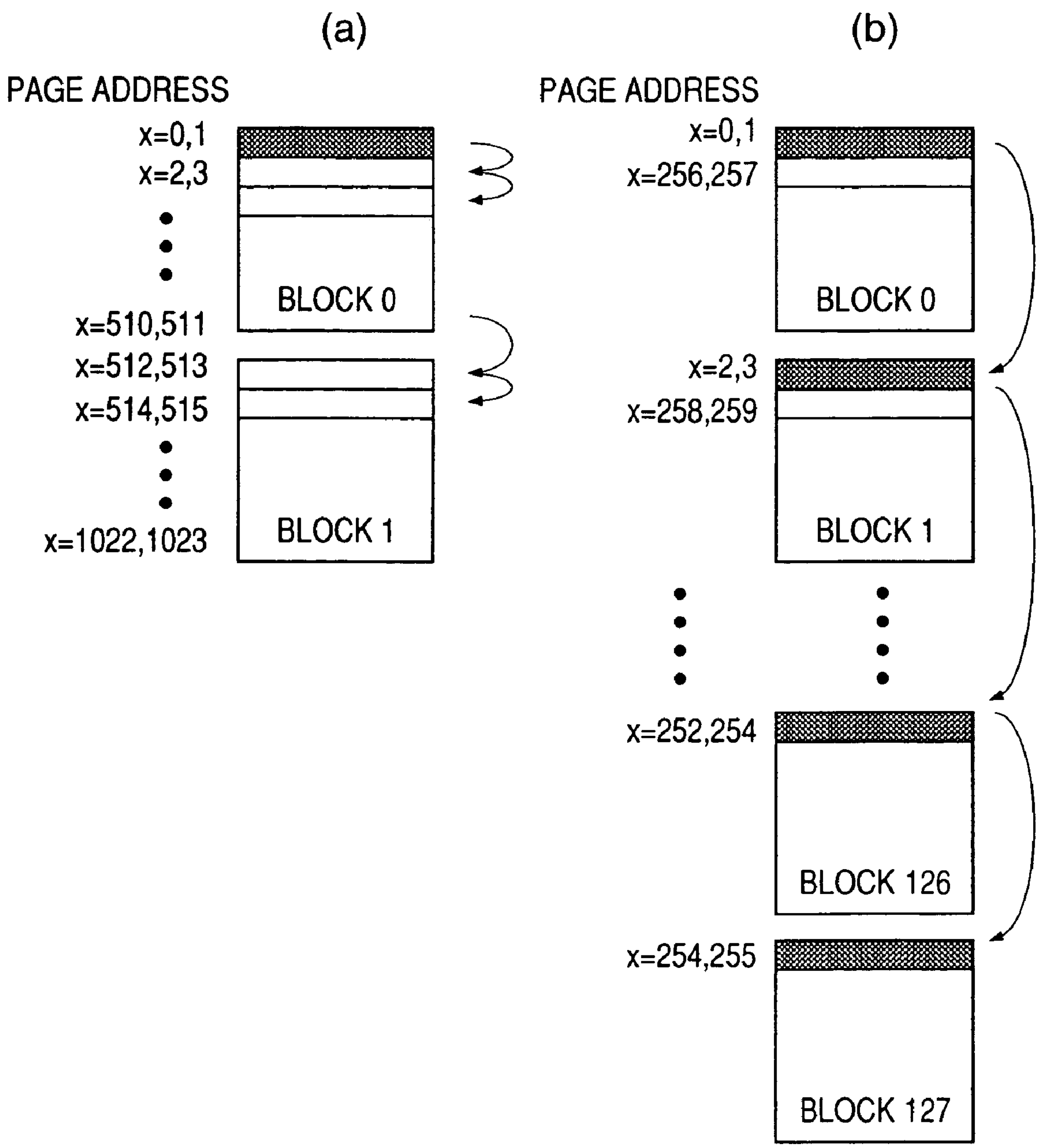
FIGS. 30(*a*) and 30(*b*) illustrate an address scramble permitting multi-page erase.

For instance as shown in FIG. 30, where two pages are allocated per word line and, as in FIG. 30(*a*) page addresses x =0, 1, x=2, 3, . . . , x=510, 511 are allocated in block 0 and page addresses x=512, 513, x=514, 515, . . . , x=1022, 1023 are allocated in block 1, if page addresses are consecutive in either block, multi-page erasure cannot be accomplished. In other words, a plurality of pages in the same block cannot be erased at the same time.

Then, by so allocating page addresses as to be consecutive between blocks such as page addresses x=0, 1, x=256, 257 in block 0, page addresses x=2, 3, x=258, 259 in block 1, and page addresses x=252, 253 in block 126, and page addresses x =254, 255 in block 127 as shown in FIG. 30(*b*), multi-page erasure is made possible. This multi-page erase mode will be described with reference to FIG. 31.

Figure 31:
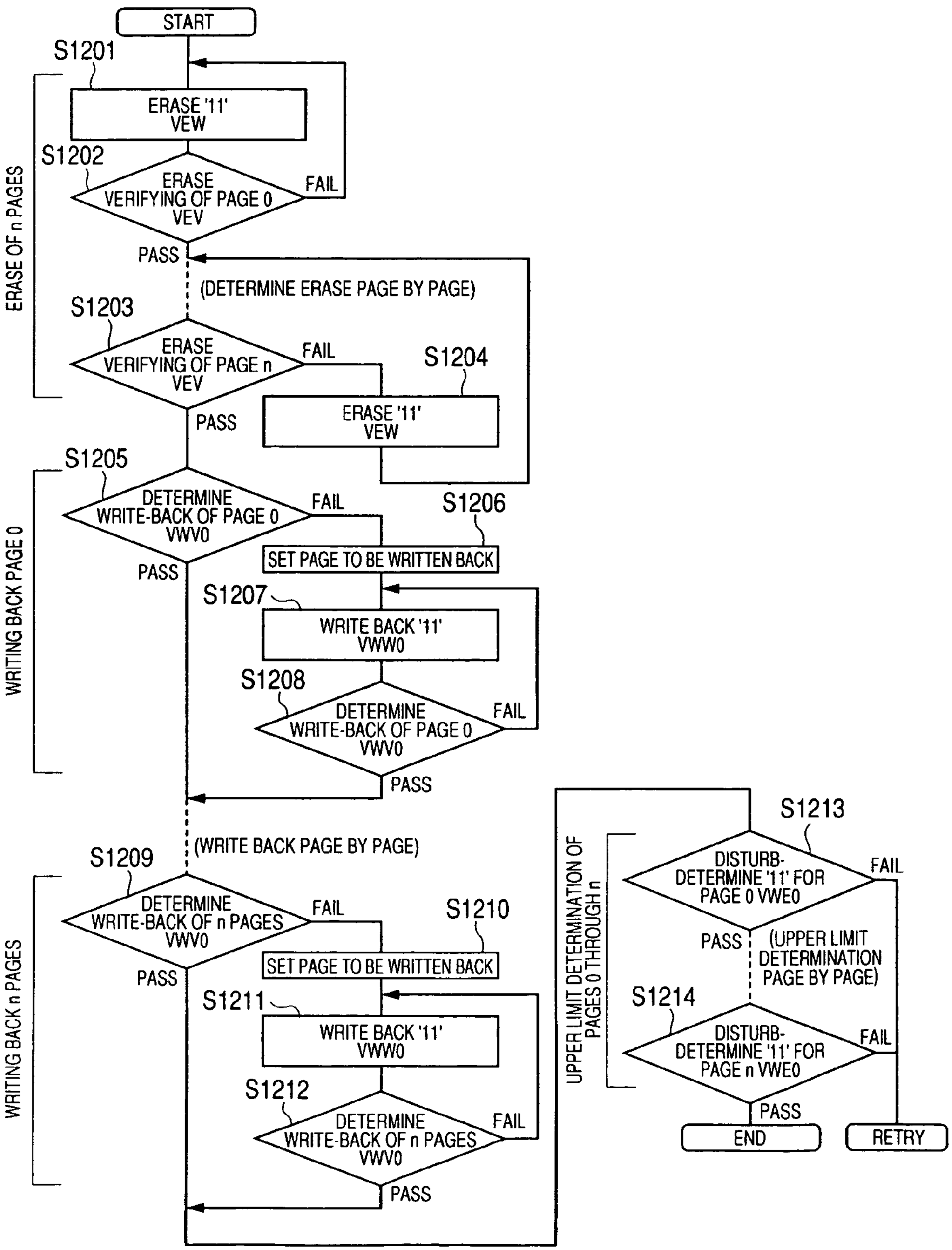
FIG. 31 is a flow chart of a multi-page erase mode.

As shown in FIG. 31, in the multi-page erase mode, page n erase, page 0 write-back processing, page n write-back processing, and page 0 through n upper limit determination processing are performed in this sequence.

(1) In the page n erase, an erase voltage (VEW) is applied to the page to be erased, followed by erase verification (erase determination voltage VEV) (steps S1201 through S1204). In this erase verification, erase determination is applied to pages 0 to n, one page at a time, and when one page passes, the determination will proceed to the next page or if any page fails, the processing from erase voltage application to erase verification will be repeated until it passes; when a prescribed length of time is surpassed, the processing will come to an abnormal end.

(2) In the page 0 write-back processing, write-back determination (write-back determination voltage VWV0) is applied to page 0 (step S1205). When the page passes this write-back determination, the determination will proceed to the next page or if any page fails, after setting the page to be written back, a write-back voltage (VWW0) will be applied to the page to be written back, followed by further write-back determination (write-back determination voltage VWV0) (steps S1206 through S1208). When the page passes this write-back determination, the determination will proceed to the next page or if any page fails, the processing from write-back voltage application to write-back determination will be repeated until it passes; when a prescribed length of time is surpassed, the processing will come to an abnormal end.

(3) In the page n write-back processing, after the end of the page 0 write-back processing described above, write-back processing is applied to pages 0 to n, one page at a time as in the page 0 write-back processing described above, followed by write-back determination on page n, setting of the page to be written back, application of the write-back voltage to the page to be written back, and write-back determination in this sequence (steps S1209 through S1212).

(4) In the 0 through n upper limit determination processing, page 0 is subjected to word disturb determination (upper limit determination voltage VWE0) (step S1213). When the page passes this word disturb determination, the determination will proceed to the next page or if any page fails, it will be retried. After that, as in the page 0 word disturb determination described above, page 1 though n−1 will be subjected to upper limit determination one page at a time, and page n will then be subjected to word disturb determination (step S1214).

Therefore, the flash memory in this mode for carrying out the invention can provide the following advantages.

(1) In the write mode of write operation from the lower voltage side, the length of writing time can be shortened, and the write operation increased in speed, by reducing the number of data transfers from the SRAMs to the sense latch circuit. For instance, the number of transfers can be reduced to four, compared with the write mode from the higher voltage side (=six transfers).

(2) In the write mode using simplified upper limit determination of write operation, the length of writing time can be shortened, and the write operation increased in speed, by reducing the number of data transfers from the SRAMs to the sense latch circuit. For instance, the number of transfers can be halved to three, compared with the write mode from the higher voltage side (=six transfers). Further, as the 1×sense latch circuit +2×SRAM configuration can also realize additional writing, no erase processing is needed when memory cells on one word line are to be divided a plurality of times and written in, and this also contributes to shortening the length of writing time.

(3) As the use of the channel hot electron injection formula makes it possible to reduce the write word voltage to a lower level, the use of the ISPP formula for write biasing enables the write bias to be optimized. For instance, the duration of, write biasing can be reduce to less than 1/10 of that required by the power pulse formula (590 $\mu$s to 50 $\mu$s).

(4) Regarding write operation, since the number of transfers from the SRAMs to the sense latch circuit can be reduced and the write bias can be optimized, the speed of write operation can be increased.

(5) The write transfer rate of the multi-value flash memory can be raised, and this contributes to raising the write transfer rates of flash memory cards, flash memory modules and the like using this flash memory.

(6) In the two-page erase mode of erase operation, selective erase verification of only one page of opposite pages in erase operation can contribute to accelerate the erase operation. Consecutive page-by-page write-back processing during erase operation can prevent threshold voltage fluctuations of memory cells from inviting excessive write-back faults.

(7) In the multi-page erase mode of erase operation, any desired word lines in a plurality of blocks can be erased at the same time, and by applying scramble to make page addresses consecutive between blocks, the erase rate can be enhanced.

(8) Regarding erase operation, the erase sequence can be optimized in a memory array configuration having pages per word line. Further, by enlarging the erase unit, the erase rate can be enhanced and the speed of erase operation can be increased thereby. Further, the optimization of erase determination can serve to reduce the erase determination circuit to ½.

(9) Regarding the 1×sense latch circuit+2×SRAM configuration, the square measure of cells per unit bit can be reduced by realizing read, write and erase sequences for the multi-value memory.

(10) The speed of erase operation of the flash memory can be increased and its chip area can be reduced, these advantages further contributing to increasing the erase speed and reducing the cost of flash memory cards, flash memory modules and the like using this flash memory.

While the invention achieved by the present inventor has been hitherto described with reference to specific modes of implementation thereof, obviously the invention is not limited to these modes.

In the described modes of implementation, for instance, the data transfer circuit is supposed to have a 1×sense latch circuit +2×SRAM configuration (FIG. 6), write data buffers need not be SRAMs from the viewpoint of reducing the required number of write data transfers. The invention can as well be applied to the use of a data latch circuit for instance.

In the write operation in the described modes of implementation, the write mode using simplified upper limit determination (FIG. 20) supposes consecutive "write processing" and "upper limit determination processing" every time the threshold voltage of memory cells is written, the upper limit determination processing can as well be performed collectively at the end of the write flow. The word disturb determination of erase distribution can be done at any time only if the writing of the "01" distribution, at which the voltage is the highest, is completed.

Further in the erase operation in the described modes of implementation, where the two-page erase mode (FIG. 26) is applied, there is no restriction on the number of pages that can be erased at the same time. In other words, where a plurality of pages fluctuating in erase characteristics similarly to any given page are to be erased at the same time, this method can be applied. Nor does the memory array configuration to be thinned out in bit lines density.

INDUSTRIAL APPLICABILITY

As hitherto described, the semiconductor memory device pertaining to the present invention can be applied with particular effectiveness to a multi-value flash memory mounted with a data buffer, a flash memory using a channel hot electron injection formula and, regarding erase operation, a flash memory in which a plurality of pages are connected correspondingly to each word line. It can also be extensively applied to a nonvolatile semiconductor memory device mounted with a data buffer, a semiconductor device using a flash memory, a semiconductor memory card, a semiconductor memory module and so forth.

What is claimed is:

1. A nonvolatile semiconductor memory device, comprising:

a plurality of word lines;

a plurality of bit lines;

a plurality of memory cells each connected to a corresponding word line and a corresponding bit line and having a control gate and a floating gate; and a memory array having each of said plurality of memory cells so configured as to be able to store data of a plurality of bits as threshold voltages, wherein said nonvolatile semiconductor memory device includes a write mode in which write operation is performed for moving the threshold voltage of the memory cells to be written within the side of a lower threshold voltage distribution, and upper limit determination processing to confirm that no excessive writing of each threshold voltage distribution is performed for all the memory cells, and write processing of the following threshold voltage distribution is started, and wherein said write processing and said upper limit determination processing are consecutively applied to each threshold voltage distribution.

2. The nonvolatile semiconductor memory device according to claim 1, comprising:

a sense latch circuit connected to each of said plurality of memory cells and holding information on memory cells to be written in; and a memory circuit connected to said sense latch circuit via a common input/output line and storing write data, wherein, upon write processing for each of said plurality of memory cells, write data on said memory circuit are transferred to said sense latch circuit, and then are written into memory cells to be written in.

3. The nonvolatile semiconductor memory device according to claim 1, wherein, of each of said plurality of memory cells, the control gate is connected to a corresponding word line, a drain is commonly connected to bit lines, and a source is commonly connected to a common line via a MOSFET driven by a gate control signal.

4. A nonvolatile semiconductor memory device comprising:

a plurality of word lines;

a plurality of bit lines;

a plurality of memory cells each connected to a corresponding word line and a corresponding bit line and having a control gate and a floating gate; and a memory array including each of said plurality of memory cells so configured as to be able to store data of a plurality of bits as threshold voltages, wherein said nonvolatile semiconductor memory device comprises a write mode in which write processing is performed for moving threshold voltage of memory cell within a level n threshold voltage distribution and within a level n+1 threshold voltage distribution, read processing is performed at an upper limit determination voltage level of said level n threshold voltage distribution and a read voltage level of said level n threshold voltage distribution without discriminating any of the memory cells from others, and the existence of no memory cell having a threshold voltage distribution between said upper limit determination voltage level and said read voltage level is determined, the write mode including upper limit determination processing to confirm that no excessive writing is done.

5. The nonvolatile semiconductor memory device according to claim 4, wherein after the write processing of said plurality of threshold voltage distributions is completed, upper limit determination processing is performed for a lowest erase level of threshold voltage distribution.

6. The nonvolatile semiconductor memory device according to claim 4, wherein said upper limit determination processing is to determine the memory cell subject to upper limit determination on the basis of data stored in the memory cell, and to perform additional write processing for writing again, without erasure, into any memory cell on a word line having already undergone write processing.

7. The nonvolatile semiconductor memory device according to claim 4, comprising:

a sense latch circuit connected to each of said plurality of memory cells and holding information on memory cells to be written in; and a memory circuit connected to said sense latch circuit via a common input/output line and storing write data, wherein, upon write processing for each of said plurality of memory cells, write data on said memory circuit are transferred to said sense latch circuit, and then are written into memory cells to be written in.

8. The nonvolatile semiconductor memory device according to claim 4, wherein, of each of said plurality of memory cells, the control gate is connected to a corresponding word line, a drain is commonly connected to bit lines, and a source is commonly connected to a common line via a MOSFET driven by a gate control signal.

9. A writing method of a nonvolatile semiconductor memory device capable of storing information of a plurality of bits in one memory cell, wherein a threshold voltage of a memory cell for storing first information is varied within a first threshold voltage distribution, an operation to vary the threshold voltage is ended by detecting that the threshold voltage of the memory cell is higher than a first determination voltage, and determination that the threshold voltage of the memory cell for storing said first information is lower than a second determination voltage is performed, and wherein when the threshold voltage of the memory cell for storing said first information is lower than the second determination voltage, processing to write into a memory cell for storing second information having a higher threshold voltage distribution than said first threshold voltage distribution is performed.

10. A writing method of a nonvolatile semiconductor memory device comprising a plurality of memory cells in which a threshold voltage is set for each memory cell according to information to be stored therein, wherein the threshold voltage of said memory cell is set to be contained in one of a plurality of threshold voltage distributions, wherein said plurality of threshold distributions have one threshold voltage distribution indicating an erased state and two or more threshold voltage distributions indicating written states, wherein a first threshold voltage distribution indicating a first written state is closer than a second threshold voltage distribution indicating a second written state to the erase threshold voltage distribution indicating the erased state, and wherein, in any memory cell whose threshold voltage is set to be within said first threshold voltage distribution, writing and determination are repeated until the threshold voltage surpasses a first determination voltage, determination is made as to whether or not there is a memory cell whose threshold voltage is higher than a second determination voltage and, in the absence of any memory cell whose threshold voltage is higher than the second determination voltage, the operation to write into said first written state is determined to have been completed.

11. The writing method of the nonvolatile semiconductor memory device according to claim 10, wherein after the operation to write into said first written state is completed, operation to write into said second written state is performed.

12. The writing method of the nonvolatile semiconductor memory device according to claim 11, wherein in the operation to write into said first written state, in the presence of any memory cell having a threshold voltage higher than said second determination voltage, the operation to write into said second written state is not performed.

* * * * *